United States Patent
Kim

(10) Patent No.: US 10,726,889 B2
(45) Date of Patent: Jul. 28, 2020

(54) SEMICONDUCTOR DEVICES

(71) Applicant: SK hynix Inc., Icheon-si, Gyeonggi-do (KR)

(72) Inventor: Woongrae Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/399,421

(22) Filed: Apr. 30, 2019

(65) Prior Publication Data

US 2020/0135248 A1   Apr. 30, 2020

(30) Foreign Application Priority Data

Oct. 29, 2018 (KR) .......................... 10-2018-0130179

(51) Int. Cl.
*G06F 13/16* (2006.01)
*G11C 8/18* (2006.01)
*G11C 7/22* (2006.01)
*G11C 8/06* (2006.01)

(52) U.S. Cl.
CPC ............... *G11C 8/18* (2013.01); *G11C 7/222* (2013.01); *G11C 8/06* (2013.01)

(58) Field of Classification Search
CPC ............ G11C 8/18; G11C 7/222; G11C 8/06
USPC ................................................... 365/230.03
See application file for complete search history.

(56) References Cited

U.S. PATENT DOCUMENTS

| 9,870,325 | B2* | 1/2018 | Bains | G06F 13/1684 |
| 2014/0325105 | A1* | 10/2014 | Prete | G06F 13/1642 710/112 |
| 2015/0302904 | A1* | 10/2015 | Yoon | G06F 13/1663 711/105 |
| 2016/0342539 | A1 | 11/2016 | Bains | |

FOREIGN PATENT DOCUMENTS

KR    101735091 B1    5/2017

\* cited by examiner

*Primary Examiner* — Xiaochun L Chen
(74) *Attorney, Agent, or Firm* — William Park & Associates Ltd.

(57) ABSTRACT

A semiconductor device includes a control circuit and an address generation circuit. The control circuit generates a write column address signal, a write bank selection signal and an internal write bank selection signal from a command/address signal during a write operation. The control circuit also generates a read column address signal, a read bank selection signal and an internal read bank selection signal from the command/address signal during a read operation. The address generation circuit outputs the write column address signal as a bank group address signal in synchronization with the write bank selection signal and the internal write bank selection signal or outputs the read column address signal as the bank group address signal in synchronization with the read bank selection signal and the internal read bank selection signal.

23 Claims, 20 Drawing Sheets

SEMICONDUCTOR DEVICES

CROSS-REFERENCE TO RELATED APPLICATIONS

The present application claims priority under 35 U.S.C 119(a) to Korean Application No. 10-2018-0130179, filed on Oct. 29, 2018, which is incorporated herein by reference in its entirety.

BACKGROUND

1. Technical Field

Embodiments of the present disclosure generally relate to semiconductor devices relating to a column operation.

2. Related Art

In general, each of semiconductor devices such as dynamic random access memory (DRAM) devices may include a plurality of bank groups comprised of cell arrays which are selected by addresses. Each of the bank groups may be realized to include a plurality of banks. The semiconductor device may select any one of the plurality of bank groups and may perform a column operation for outputting data stored in a cell array included in the selected bank group through input/output (I/O) lines.

SUMMARY

According to an embodiment, a semiconductor device includes a control circuit and an address generation circuit. The control circuit generates a write column address signal from a command/address signal during a write operation and generates a write bank selection signal and an internal write bank selection signal from the command/address signal during the write operation. The control circuit also generates a read column address signal from the command/address signal during a read operation and generates a read bank selection signal and an internal read bank selection signal from the command/address signal during the read operation. The write bank selection signal and the internal write bank selection signal are sequentially enabled, and wherein the read bank selection signal and the internal read bank selection signal are sequentially enabled. The address generation circuit outputs the write column address signal as a bank group address signal in synchronization with the write bank selection signal and the internal write bank selection signal or outputs the read column address signal as the bank group address signal in synchronization with the read bank selection signal and the internal read bank selection signal.

According to an embodiment, a semiconductor device includes a control circuit, an address generation circuit and a core circuit. The control circuit generates first and second write column address signals, first and second write bank selection signals and first and second internal write bank selection signals from a command/address signal during a write operation. The control circuit also generates first and second read column address signals, first and second read bank selection signals and first and second internal read bank selection signals from the command/address signal during a read operation. The address generation circuit outputs the first and second write column address signals as first and second bank group address signals in synchronization with the first and second write bank selection signals and the first and second internal write bank selection signals or outputs the first and second read column address signals as the first and second bank group address signals in synchronization with the first and second read bank selection signals and the first and second internal read bank selection signals. The core circuit includes a first bank group and a second bank group. The first bank group performs the write operation and the read operation when the first bank group address signal is enabled, and the second bank group performs the write operation and the read operation when the second bank group address signal is enabled.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

In the present disclosure, semiconductor devices may provide a bank group mode, an 8-bank mode and a 16-bank mode. A bank group may include a plurality of banks. For example, the bank group may include four banks. In the bank group mode, a column operation for one bank included in the bank group may be performed by one command. In the 8-bank mode, column operations for two banks respectively included in separate bank groups are sequentially performed by one command. In the 16-bank mode, column operations for four banks respectively included in separate bank groups are sequentially performed by one command.

Figure 1:
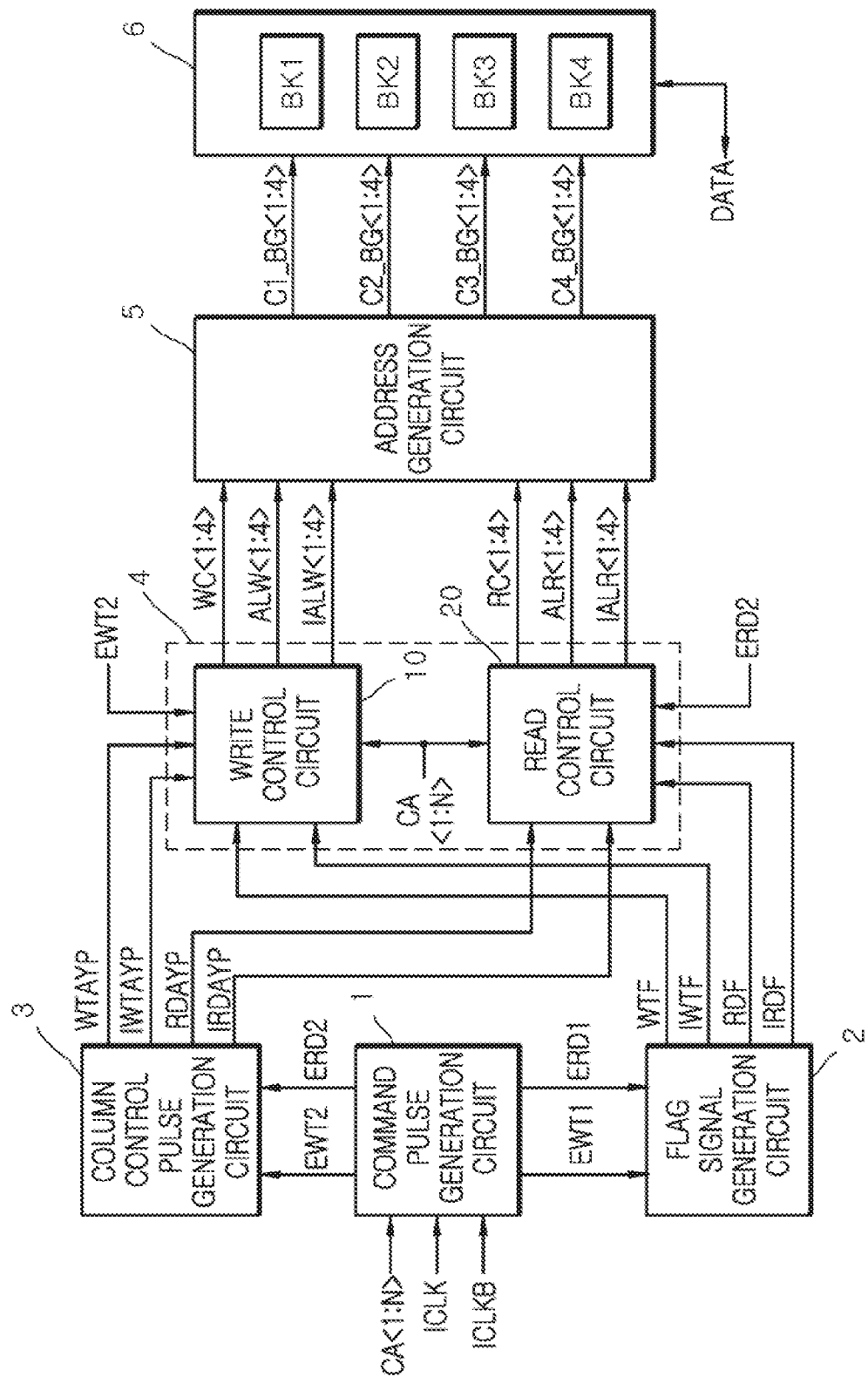
FIG. 1 is a block diagram illustrating a configuration of a semiconductor device according to an embodiment of the present disclosure.

As illustrated in FIG. 1, a semiconductor device according to an embodiment may include a command pulse generation circuit 1, a flag signal generation circuit 2, a column control pulse generation circuit 3, a control circuit 4, an address generation circuit 5 and a core circuit 6.

The command pulse generation circuit 1 may generate a first write command pulse EWT1, a second write command pulse EWT2, a first read command pulse ERD1 and a second read command pulse ERD2 according to first to $N^{th}$ command/address signals CA<1:N>, an internal clock signal ICLK and an inverted internal clock signal ICLKB. The first to $N^{th}$ command/address signals CA<1:N> may include a command and an address provided by an external device. The internal clock signal ICLK may be toggled in synchronization with a rising edge of a clock signal (not shown) provided by an external device. The inverted internal clock signal ICLKB may be toggled in synchronization with a falling edge of a clock signal (not shown) provided by an external device. The number 'N' of bits included in the first to $N^{th}$ command/address signals CA<1:N> may be set to be different according to the embodiments.

The command pulse generation circuit 1 may decode the first to $N^{th}$ command/address signals CA<1:N> in synchronization with the internal clock signal ICLK or the inverted internal clock signal ICLKB to generate the first write command pulse EWT1 and the second write command pulse EWT2 for performing a write operation. According to an embodiment, in order to perform the write operation, the command pulse generation circuit 1 may decode the first to $N^{th}$ command/address signals CA<1:N> in synchronization with the internal clock signal ICLK to generate the first write command pulse EWT1 and may then shift the first write command pulse EWT1 in synchronization with the inverted internal clock signal ICLKB to generate the second write command pulse EWT2. A point of time when the first write command pulse EWT1 is generated to perform the write operation may be determined as a point of time when the first to $N^{th}$ command/address signals CA<1:N> having a logic level combination for performing the write operation are inputted to the command pulse generation circuit 1 in synchronization with a rising edge of the internal clock signal ICLK.

The command pulse generation circuit 1 may decode the first to $N^{th}$ command/address signals CA<1:N> in synchronization with the internal clock signal ICLK or the inverted internal clock signal ICLKB to generate the first read command pulse ERD1 and the second read command pulse ERD2 for performing a read operation. According to an embodiment, in order to perform the read operation, the command pulse generation circuit 1 may decode the first to $N^{th}$ command/address signals CA<1:N> in synchronization with the internal clock signal ICLK to generate the first read command pulse ERD1 and may then shift the first read command pulse ERD1 in synchronization with the inverted internal clock signal ICLKB to generate the second read command pulse ERD2. A point of time when the first read command pulse ERD1 is generated to perform the read operation may be determined as a point of time when the first to $N^{th}$ command/address signals CA<1:N> having a logic level combination for performing the read operation are inputted to the command pulse generation circuit 1 in synchronization with a rising edge of the internal clock signal ICLK.

The flag signal generation circuit 2 may generate a write flag signal WTF, an internal write flag signal IWTF, a read flag signal RDF and an internal read flag signal IRDF according to the first write command pulse EWT1 and the first read command pulse ERD1.

The flag signal generation circuit 2 may generate the write flag signal WTF after a predetermined period elapses from a point of time when the first write command pulse EWT1 is created. The flag signal generation circuit 2 may shift the first write command pulse EWT1 by the predetermined period to generate the write flag signal WTF. The predetermined period for shifting the first write command pulse EWT1 may be set to be different according to the embodiments. The flag signal generation circuit 2 may shift the write flag signal WTF by a predetermined period to generate the internal write flag signal IWTF. The predetermined period for shifting the write flag signal WTF may be a period which is set to perform a column operation according to a write latency. The predetermined period for shifting the write flag signal WTF may be set to be different according to the embodiments.

The word "predetermined" as used herein with respect to a parameter, such as a predetermined period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The flag signal generation circuit 2 may generate the read flag signal RDF after a predetermined period elapses from a point of time when the first read command pulse ERD1 is created. The flag signal generation circuit 2 may shift the first read command pulse ERD1 by the predetermined period to generate the read flag signal RDF. The predetermined period for shifting the first read command pulse ERD1 may be set according to a read latency. The predetermined period for shifting the first read command pulse ERD1 may be set to be different according to the embodiments. The flag signal generation circuit 2 may shift the read flag signal RDF by a predetermined period to generate the internal read flag signal IRDF. The predetermined period for shifting the read flag signal RDF may be a period which is set to perform the column operation according to a burst length. The predetermined period for shifting the read flag signal RDF may be set to be different according to the embodiments. In some other embodiments, the flag signal generation circuit 2 may be realized to generate the write flag signal WTF, the internal write flag signal IWTF, the read flag signal RDF and the internal read flag signal IRDF according to the second write command pulse EWT2 and the second read command pulse ERD2.

The column control pulse generation circuit 3 may generate a write column control pulse WTAYP, an internal write column control pulse IWTAYP, a read column control pulse RDAYP and an internal read column control pulse IRDAYP according to the second write command pulse EWT2 and the second read command pulse ERD2.

The column control pulse generation circuit 3 may generate the write column control pulse WTAYP and the internal write column control pulse IWTAYP if the second write command pulse EWT2 is enabled. The column control pulse generation circuit 3 may sequentially generate the write column control pulse WTAYP and the internal write column control pulse IWTAYP after a predetermined period elapses from a point of time when the second write command pulse EWT2 is created. The column control pulse generation circuit 3 may shift the second write command pulse EWT2 by the predetermined period to generate the write column control pulse WTAYP. The predetermined period for shifting the second write command pulse EWT2 may be set according to the write latency. The predetermined period for shifting the second write command pulse EWT2 may be set to be different according to the embodiments. The column control pulse generation circuit 3 may shift the write column control pulse WTAYP by a predetermine period to generate the internal write column control pulse IWTAYP. The predetermine period for shifting the write column control pulse WTAYP may be a period which is set to perform the column operation according to the burst length. The predetermine period for shifting the write column control pulse WTAYP may be set to be different according to the embodiments.

The column control pulse generation circuit 3 may generate the read column control pulse RDAYP and the internal read column control pulse IRDAYP in response to the second read command pulse ERD2. The column control pulse generation circuit 3 may sequentially generate the read column control pulse RDAYP and the internal read column control pulse IRDAYP after a predetermined period elapses from a point of time when the second read command pulse ERD2 is created. The column control pulse generation circuit 3 may shift the second read command pulse ERD2 by the predetermined period to generate the read column control pulse RDAYP. The predetermined period for shifting the second read command pulse ERD2 may be set according to the read latency. The predetermined period for shifting the second read command pulse ERD2 may be set to be different according to the embodiments. The column control pulse generation circuit 3 may shift the read column control pulse RDAYP by a predetermined period to generate the internal read column control pulse IRDAYP. The predetermined period for shifting the read column control pulse RDAYP may be a period which is set to perform the column operation according to the burst length. The predetermined period for shifting the read column control pulse RDAYP may be set to be different according to the embodiments. In some other embodiments, the column control pulse generation circuit 3 may be realized to generate the write column control pulse WTAYP, the internal write column control pulse IWTAYP, the read column control pulse RDAYP and the internal read column control pulse IRDAYP according to the first write command pulse EWT1 and the first read command pulse ERD1.

The control circuit 4 may include a write control circuit 10 and a read control circuit 20.

The write control circuit 10 may be synchronized with the write column control pulse WTAYP and the internal write column control pulse IWTAYP to generate first to fourth write column address signals WC<1:4> from the first to $N^{th}$ command/address signals CA<1:N>.

The write control circuit 10 may be synchronized with the write column control pulse WTAYP and the internal write column control pulse IWTAYP to generate first to fourth write bank selection signals ALW<1:4> and first to fourth internal write bank selection signals IALW<1:4> from the first to $N^{th}$ command/address signals CA<1:N>. The write control circuit 10 may be synchronized with the write flag signal WTF and the internal write flag signal IWTF to latch the first to $N^{th}$ command/address signals CA<1:N>. The write control circuit 10 may be synchronized with the write column control pulse WTAYP and the internal write column control pulse IWTAYP to generate the first to fourth write bank selection signals ALW<1:4> and the first to fourth internal write bank selection signals IALW<1:4> from the latched signals of the first to $N^{th}$ command/address signals CA<1:N>.

The read control circuit 20 may be synchronized with the read column control pulse RDAYP and the internal read column control pulse IRDAYP to generate first to fourth read column address signals RC<1:4> from the first to $N^{th}$ command/address signals CA<1:N>.

The read control circuit 20 may be synchronized with the read column control pulse RDAYP and the internal read column control pulse IRDAYP to generate first to fourth read bank selection signals ALR<1:4> and first to fourth internal read bank selection signals IALR<1:4> from the first to $N^{th}$ command/address signals CA<1:N>. The read control circuit 20 may be synchronized with the read flag signal RDF and the internal read flag signal IRDF to latch the first to $N^{th}$ command/address signals CA<1:N>. The read control circuit 20 may be synchronized with the read column control pulse RDAYP and the internal read column control pulse IRDAYP to generate the first to fourth read bank selection signals ALR<1:4> and the first to fourth internal read bank selection signals IALR<1:4> from the latched signals of the first to $N^{th}$ command/address signals CA<1:N>.

The control circuit 4 having an aforementioned configuration may generate the first to fourth write column address signals WC<1:4> from the first to $N^{th}$ command/address signals CA<1:N> to perform the write operation. The control circuit 4 may generate the first to fourth write bank selection signals ALW<1:4> and the first to fourth internal write bank selection signals IALW<1:4> from the first to $N^{th}$ command/address signals CA<1:N> to perform the write operation. The control circuit 4 may generate the first to fourth read column address signals RC<1:4> from the first to $N^{th}$ command/address signals CA<1:N> to perform the read operation. The control circuit 4 may generate the first to fourth read bank selection signals ALR<1:4> and the first to fourth internal read bank selection signals IALR<1:4> from the first to N$^{th}$ command/address signals CA<1:N> to perform the read operation.

The address generation circuit 5 may be synchronized with the first to fourth write bank selection signals ALW<1:4> and the first to fourth internal write bank selection signals IALW<1:4> to output the first to fourth write column address signals WC<1:4> as first bank group address signals C1_BG<1>, C2_BG<1>, C3_BG<1> and C4_BG<1>. The address generation circuit 5 may be synchronized with the first to fourth write bank selection signals ALW<1:4> and the first to fourth internal write bank selection signals IALW<1:4> to output the first to fourth write column address signals WC<1:4> as second bank group address signals C1_BG<2>, C2_BG<2>, C3_BG<2> and C4_BG<2>. The address generation circuit 5 may be synchronized with the first to fourth write bank selection signals ALW<1:4> and the first to fourth internal write bank selection signals IALW<1:4> to output the first to fourth write column address signals WC<1:4> as third bank group address signals C1_BG<3>, C2_BG<3>, C3_BG<3> and C4_BG<3>. The address generation circuit 5 may be synchronized with the first to fourth write bank selection signals ALW<1:4> and the first to fourth internal write bank selection signals IALW<1:4> to output the first to fourth write column address signals WC<1:4> as fourth bank group address signals C1_BG<4>, C2_BG<4>, C3_BG<4> and C4_BG<4>.

The address generation circuit 5 may be synchronized with the first to fourth read bank selection signals ALR<1:4> and the first to fourth internal read bank selection signals IALR<1:4> to output the first to fourth read column address signals RC<1:4> as the first bank group address signals C1_BG<1>, C2_BG<1>, C3_BG<1> and C4_BG<1>. The address generation circuit 5 may be synchronized with the first to fourth read bank selection signals ALR<1:4> and the first to fourth internal read bank selection signals IALR<1:4> to output the first to fourth read column address signals RC<1:4> as the second bank group address signals C1_BG<2>, C2_BG<2>, C3_BG<2> and C4_BG<2>. The address generation circuit 5 may be synchronized with the first to fourth read bank selection signals ALR<1:4> and the first to fourth internal read bank selection signals IALR<1:4> to output the first to fourth read column address signals RC<1:4> as the third bank group address signals C1_BG<3>, C2_BG<3>, C3_BG<3> and C4_BG<3>. The address generation circuit 5 may be synchronized with the first to fourth read bank selection signals ALR<1:4> and the first to fourth internal read bank selection signals IALR<1:4> to output the first to fourth read column address signals RC<1:4> as the fourth bank group address signals C1_BG<4>, C2_BG<4>, C3_BG<4> and C4_BG<4>.

The core circuit 6 may include first to fourth bank groups BK1, BK2, BK3 and BK4.

The first bank group BK1 may perform the column operation to store data DATA into memory cells (not shown) of a bank (not shown) selected according to the first bank group address signals C1_BG<1>, C2_BG<1>, C3_BG<1> and C4_BG<1> during the write operation. The first bank group BK1 may perform the column operation to output the data DATA stored in the memory cells (not shown) of the bank (not shown) selected according to the first bank group address signals C1_BG<1>, C2_BG<1>, C3_BG<1> and C4_BG<1> during the read operation.

The second bank group BK2 may perform the column operation to store the data DATA into memory cells (not shown) of a bank (not shown) selected according to the second bank group address signals C1_BG<2>, C2_BG<2>, C3_BG<2> and C4_BG<2> during the write operation. The second bank group BK2 may perform the column operation to output the data DATA stored in the memory cells (not shown) of the bank (not shown) selected according to the second bank group address signals C1_BG<2>, C2_BG<2>, C3_BG<2> and C4_BG<2> during the read operation.

The third bank group BK3 may perform the column operation to store the data DATA into memory cells (not shown) of a bank (not shown) selected according to the third bank group address signals C1_BG<3>, C2_BG<3>, C3_BG<3> and C4_BG<3> during the write operation. The third bank group BK3 may perform the column operation to output the data DATA stored in the memory cells (not shown) of the bank (not shown) selected according to the third bank group address signals C1_BG<3>, C2_BG<3>, C3_BG<3> and C4_BG<3> during the read operation.

The fourth bank group BK4 may perform the column operation to store the data DATA into memory cells (not shown) of a bank (not shown) selected according to the fourth bank group address signals C1_BG<4>, C2_BG<4>, C3_BG<4> and C4_BG<4> during the write operation. The fourth bank group BK4 may perform the column operation to output the data DATA stored in the memory cells (not shown) of the bank (not shown) selected according to the fourth bank group address signals C1_BG<4>, C2_BG<4>, C3_BG<4> and C4_BG<4> during the read operation.

Figure 2:
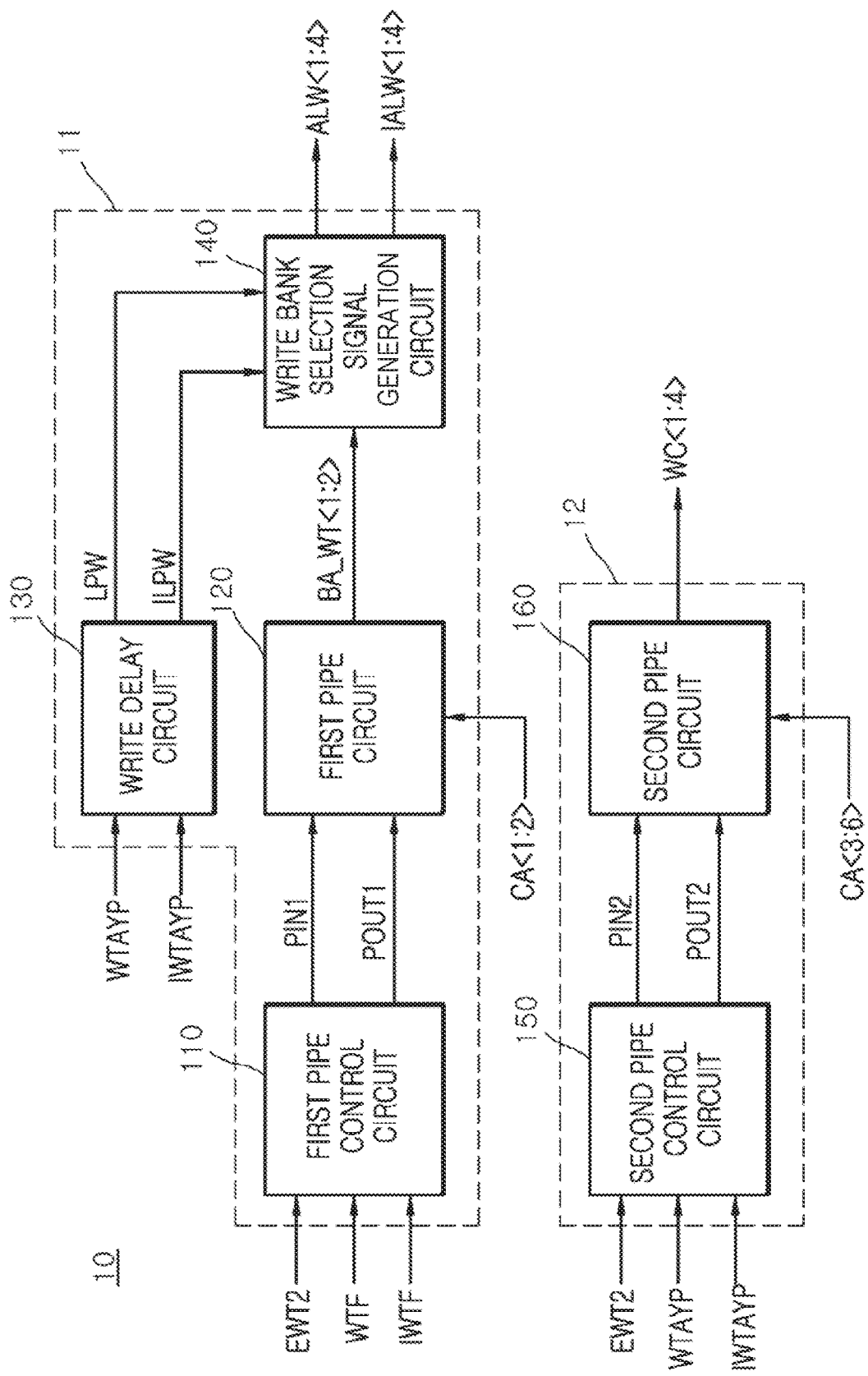
FIG. 2 is a block diagram illustrating a configuration of a write control circuit included in the semiconductor device of FIG. 1.

Referring to FIG. 2, the write control circuit 10 may include a write bank control circuit 11 and a write column control circuit 12.

The write bank control circuit 11 may include a first pipe control circuit 110, a first pipe circuit 120, a write delay circuit 130 and a write bank selection signal generation circuit 140.

The first pipe control circuit 110 may be synchronized with the write flag signal WTF and the internal write flag signal IWTF to generate a first input control signal PIN1 and a first output control signal POUT1 which are enabled, if the second write command pulse EWT2 is inputted to the first pipe control circuit 110. The first pipe control circuit 110 may generate the first input control signal PIN1 and the first output control signal POUT1 which are enabled in synchronization with the write flag signal WTF if the second write command pulse EWT2 is inputted to the first pipe control circuit 110. The first pipe control circuit 110 may generate the first input control signal PIN1 and the first output control signal POUT1 which are enabled in synchronization with the internal write flag signal IWTF if the second write command pulse EWT2 is inputted to the first pipe control circuit 110.

The first pipe circuit 120 may be synchronized with the first input control signal PIN1 and the first output control signal POUT1 to generate first and second write bank address signals BA_WT<1:2> from the first and second command/address signals CA<1:2>. The first pipe circuit 120 may be synchronized with the first input control signal PIN1 to latch the first and second command/address signals CA<1:2> and may then be synchronized with the first output control signal POUT1 to output the latched signals of the first and second command/address signals CA<1:2> as the first and second write bank address signals BA_WT<1:2>. The first and second command/address signals CA<1:2> may be set as signals for selecting the first to fourth bank groups BK1, BK2, BK3 and BK4 included in the core circuit 6. The first and second command/address signals CA<1:2> may be inputted to the first pipe circuit 120 in synchronization with a rising edge of the inverted internal clock signal ICLKB.

The write delay circuit 130 may delay the write column control pulse WTAYP and the internal write column control pulse IWTAYP by a predetermined period to generate a write latch pulse LPW and an internal write latch pulse ILPW. The write delay circuit 130 may delay the write column control pulse WTAYP by the predetermined period to generate the write latch pulse LPW. The write delay circuit 130 may delay the internal write column control pulse IWTAYP by the predetermined period to generate the internal write latch pulse ILPW. A delay time of the write delay circuit 130 for delaying the write column control pulse WTAYP and the internal write column control pulse IWTAYP may be set to be different according to the embodiments.

The write bank selection signal generation circuit 140 may be synchronized with the write latch pulse LPW to generate the first to fourth write bank selection signals ALW<1:4> from the first and second write bank address signals BA_WT<1:2> and may be synchronized with the internal write latch pulse ILPW to generate the first to fourth internal write bank selection signals IALW<1:4> from the first and second write bank address signals BA_WT<1:2>. The write bank selection signal generation circuit 140 may be synchronized with the write latch pulse LPW to generate the first to fourth write bank selection signals ALW<1:4>, one of which is selectively enabled according to a logic level combination of the first and second write bank address signals BA_WT<1:2>. The write bank selection signal generation circuit 140 may be synchronized with the internal write latch pulse ILPW to generate the first to fourth internal write bank selection signals IALW<1:4>, one of which is selectively enabled according to a logic level combination of the first and second write bank address signals BA_WT<1:2>.

The write bank control circuit 11 may latch the first and second command/address signals CA<1:2> in synchronization with the write flag signal WTF and the internal write flag signal IWTF if the second write command pulse EWT2 is enabled to perform the write operation. The write bank control circuit 11 may be synchronized with the write column control pulse WTAYP and the internal write column control pulse IWTAYP to generate the first to fourth write bank selection signals ALW<1:4> and the first to fourth internal write bank selection signals IALW<1:4> from the latched signals of the first and second command/address signals CA<1:2>.

The write column control circuit 12 may include a second pipe control circuit 150 and a second pipe circuit 160.

The second pipe control circuit 150 may generate a second input control signal PIN2 and a second output control signal POUT2 which are enabled in synchronization with the write column control pulse WTAYP and the internal write column control pulse IWTAYP if the second write command pulse EWT2 is inputted to the second pipe control circuit 150. The second pipe control circuit 150 may generate the second input control signal PIN2 and the second output control signal POUT2 which are enabled in synchronization with the write column control pulse WTAYP if the second write command pulse EWT2 is inputted to the second pipe control circuit 150. The second pipe control circuit 150 may generate the second input control signal PIN2 and the second output control signal POUT2 which are enabled in synchronization with the internal write column control pulse IWTAYP if the second write command pulse EWT2 is inputted to the second pipe control circuit 150.

The second pipe circuit 160 may be synchronized with the second input control signal PIN2 and the second output control signal POUT2 to generate the first to fourth write column address signals WC<1:4> from the third to sixth command/address signals CA<3:6>. The second pipe circuit 160 may be synchronized with the second input control signal PIN2 to latch the third to sixth command/address signals CA<3:6> and may then be synchronized with the second output control signal POUT2 to output the latched signals of the third to sixth command/address signals CA<3: 6> as the first to fourth write column address signals WC<1:4>. The third to sixth command/address signals CA<3:6> may be set as signals for selecting memory cells (not shown) included in the first to fourth bank groups BK1, BK2, BK3 and BK4. The third to sixth command/address signals CA<3:6> may be inputted to the second pipe circuit 160 in synchronization with a rising edge of the inverted internal clock signal ICLKB.

The write column control circuit 12 may generate the first to fourth write column address signals WC<1:4> from the third to sixth command/address signals CA<3:6> in synchronization with the write column control pulse WTAYP and the internal write column control pulse IWTAYP if the second write command pulse EWT2 is inputted to the write column control circuit 12.

The write control circuit 10 may generate the first to fourth write bank selection signals ALW<1:4> and the first to fourth internal write bank selection signals IALW<1:4> from the first and second command/address signals CA<1: 2> in synchronization with the write flag signal WTF and the internal write flag signal IWTF. The write control circuit 10 may generate the first to fourth write column address signals WC<1:4> from the third to sixth command/address signals CA<3:6> in synchronization with the write column control pulse WTAYP and the internal write column control pulse IWTAYP.

Figure 3:
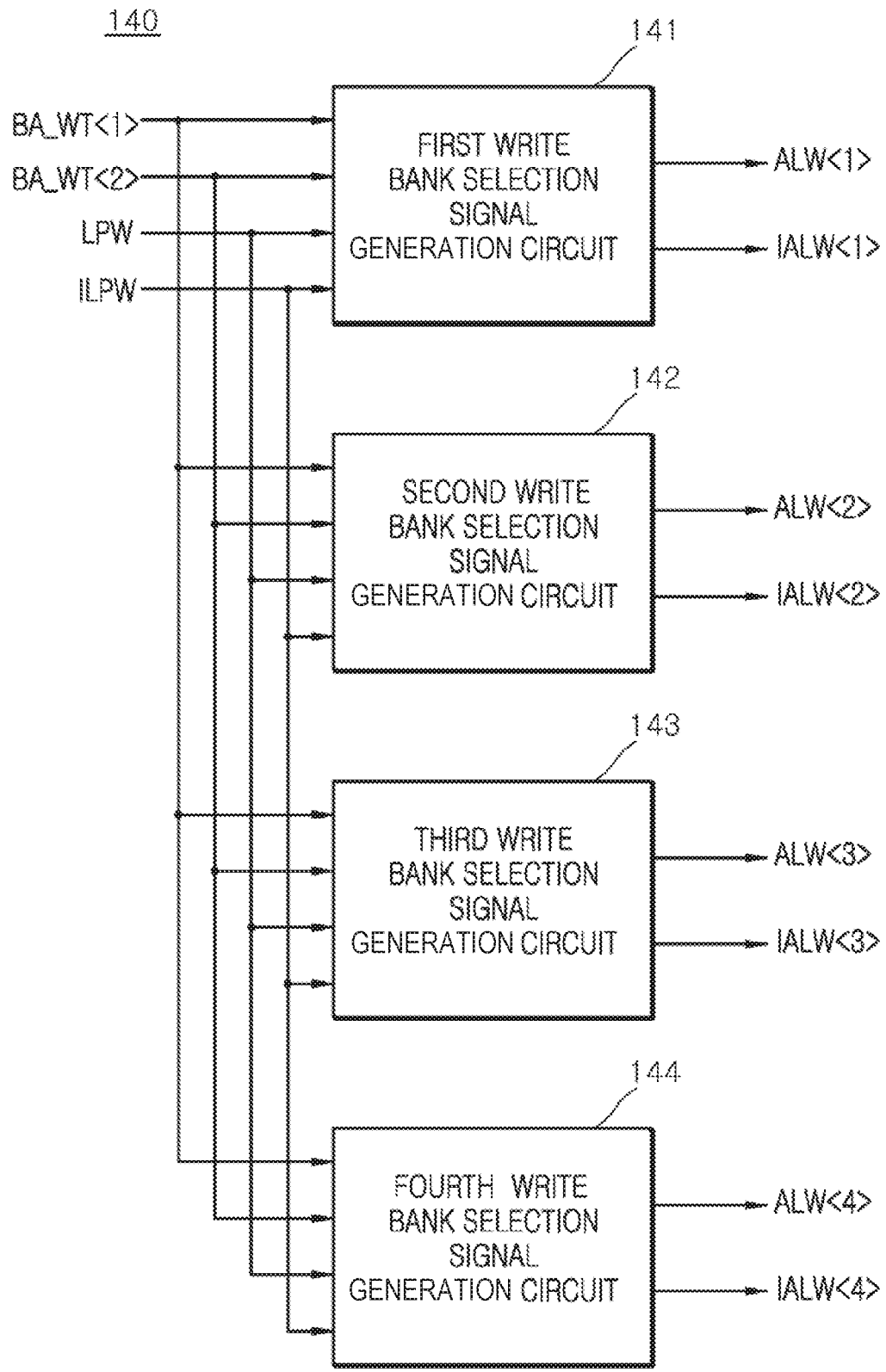
FIG. 3 is a block diagram illustrating a configuration of a write bank selection signal generation circuit included in the write control circuit of FIG. 2.

Referring to FIG. 3, the write bank selection signal generation circuit 140 may include a first write bank selection signal generation circuit 141, a second write bank selection signal generation circuit 142, a third write bank selection signal generation circuit 143 and a fourth write bank selection signal generation circuit 144.

The first write bank selection signal generation circuit 141 may generate the first write bank selection signal ALW<1> which is enabled in synchronization with the write latch pulse LPW if the first and second write bank address signals BA_WT<1:2> have a first logic level combination. The first write bank selection signal generation circuit 141 may generate the first internal write bank selection signal IALW<1> which is enabled in synchronization with the internal write latch pulse ILPW if the first and second write bank address signals BA_WT<1:2> have the first logic level combination. The first logic level combination of the first and second write bank address signals BA_WT<1:2> means that the first write bank address signal BA_WT<1> has a logic "low" level and the second write bank address signal BA_WT<2> has a logic "low" level.

The second write bank selection signal generation circuit 142 may generate the second write bank selection signal ALW<2> which is enabled in synchronization with the write latch pulse LPW if the first and second write bank address signals BA_WT<1:2> have a second logic level combination. The second write bank selection signal generation circuit 142 may generate the second internal write bank selection signal IALW<2> which is enabled in synchronization with the internal write latch pulse ILPW if the first and second write bank address signals BA_WT<1:2> have the second logic level combination. The second logic level combination of the first and second write bank address signals BA_WT<1:2> means that the first write bank address signal BA_WT<1> has a logic "high" level and the second write bank address signal BA_WT<2> has a logic "low" level.

The third write bank selection signal generation circuit 143 may generate the third write bank selection signal ALW<3> which is enabled in synchronization with the write latch pulse LPW if the first and second write bank address signals BA_WT<1:2> have a third logic level combination. The third write bank selection signal generation circuit 143 may generate the third internal write bank selection signal IALW<3> which is enabled in synchronization with the internal write latch pulse ILPW if the first and second write bank address signals BA_WT<1:2> have the third logic level combination. The third logic level combination of the first and second write bank address signals BA_WT<1:2> means that the first write bank address signal BA_WT<1> has a logic "low" level and the second write bank address signal BA_WT<2> has a logic "high" level.

The fourth write bank selection signal generation circuit 144 may generate the fourth write bank selection signal ALW<4> which is enabled in synchronization with the write latch pulse LPW if the first and second write bank address signals BA_WT<1:2> have a fourth logic level combination. The fourth write bank selection signal generation circuit 144 may generate the fourth internal write bank selection signal IALW<4> which is enabled in synchronization with the internal write latch pulse ILPW if the first and second write bank address signals BA_WT<1:2> have the fourth logic level combination. The fourth logic level combination of the first and second write bank address signals BA_WT<1:2> means that the first write bank address signal BA_WT<1> has a logic "high" level and the second write bank address signal BA_WT<2> has a logic "high" level.

Figure 4:
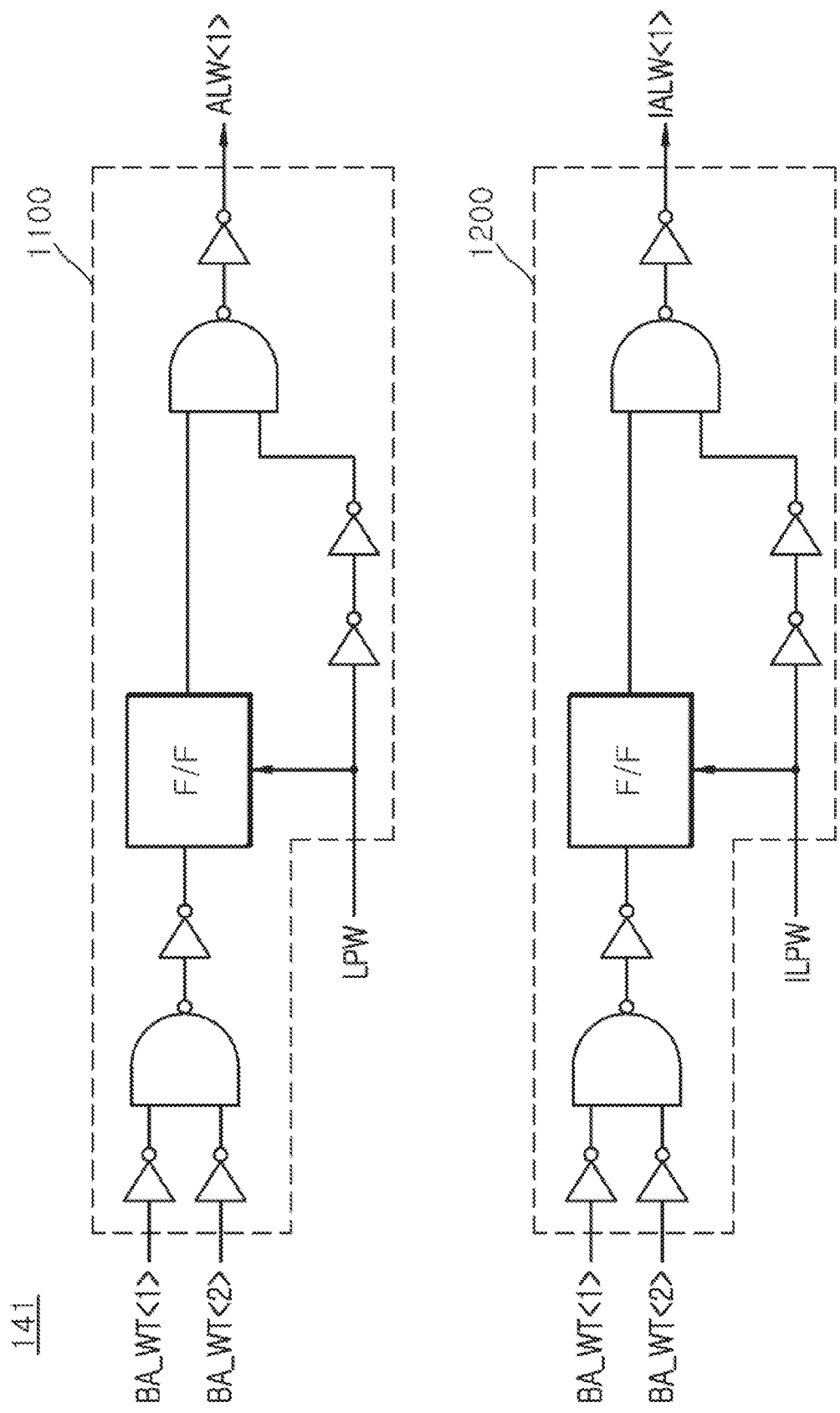
FIG. 4 is a circuit diagram illustrating a configuration of a first write bank selection signal generation circuit included in the write bank selection signal generation circuit of FIG. 3.

Referring to FIG. 4, the first write bank selection signal generation circuit 141 may include a first pulse generation circuit 1100 and a second pulse generation circuit 1200.

The first pulse generation circuit 1100 may generate the first write bank selection signal ALW<1> which is enabled to have a logic "high" level in synchronization with the write latch pulse LPW if the first and second write bank address signals BA_WT<1:2> have the first logic level combination. The first pulse generation circuit 1100 may generate the first write bank selection signal ALW<1> which is enabled to have a logic "high" level in synchronization with the write latch pulse LPW if the first write bank address signal BA_WT<1> has a logic "low" level and the second write bank address signal BA_WT<2> has a logic "low" level. In an embodiment, the first pulse generation circuit 1100 may perform inversion, NAND operations, and perform a latching operation, and may include a combination of inverters, NAND logic gates, and a flip flop F/F as illustrated in FIG. 4.

The second pulse generation circuit 1200 may generate the first internal write bank selection signal IALW<1> which is enabled to have a logic "high" level in synchronization with the internal write latch pulse ILPW if the first and second write bank address signals BA_WT<1:2> have the first logic level combination. The second pulse generation circuit 1200 may generate the first internal write bank selection signal IALW<1> which is enabled to have a logic "high" level in synchronization with the internal write latch pulse ILPW if the first write bank address signal BA_WT<1> has a logic "low" level and the second write bank address signal BA_WT<2> has a logic "low" level. In an embodiment, the second pulse generation circuit 1200 may perform inversion, NAND operations, and perform a latching operation, and may include a combination of inverters, NAND logic gates, and a flip flop F/F as illustrated in FIG. 4.

Figure 5:
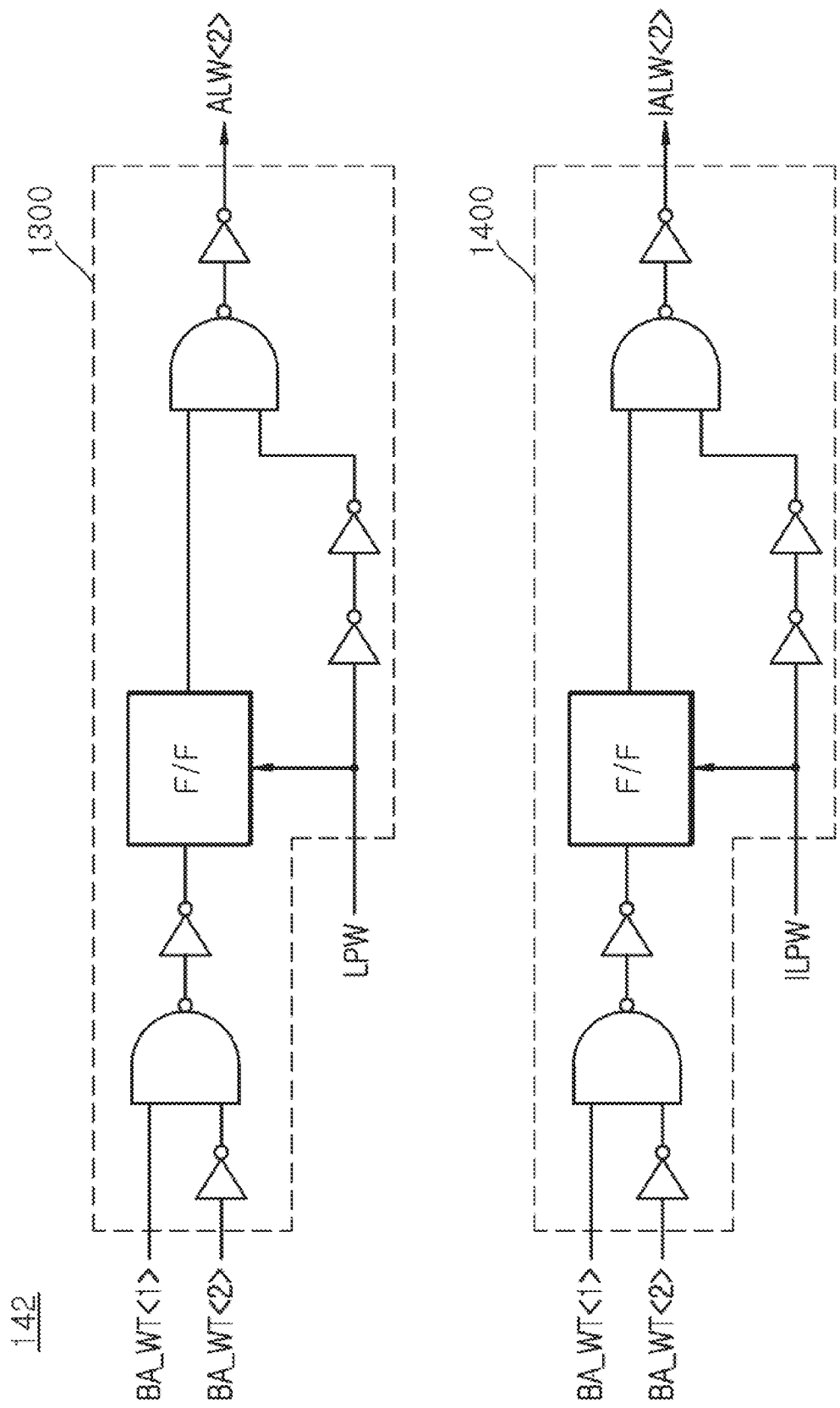
FIG. 5 is a circuit diagram illustrating a configuration of a second write bank selection signal generation circuit included in the write bank selection signal generation circuit of FIG. 3.

Referring to FIG. 5, the second write bank selection signal generation circuit 142 may include a third pulse generation circuit 1300 and a fourth pulse generation circuit 1400.

The third pulse generation circuit 1300 may generate the second write bank selection signal ALW<2> which is enabled to have a logic "high" level in synchronization with the write latch pulse LPW if the first and second write bank address signals BA_WT<1:2> have the second logic level combination. The third pulse generation circuit 1300 may generate the second write bank selection signal ALW<2> which is enabled to have a logic "high" level in synchronization with the write latch pulse LPW if the first write bank address signal BA_WT<1> has a logic "high" level and the second write bank address signal BA_WT<2> has a logic "low" level. In an embodiment, the third pulse generation circuit 1300 may perform inversion, NAND operations, and perform a latching operation, and may include a combination of inverters, NAND logic gates, and a flip flop F/F as illustrated in FIG. 5.

The fourth pulse generation circuit 1400 may generate the second internal write bank selection signal IALW<2> which is enabled to have a logic "high" level in synchronization with the internal write latch pulse ILPW if the first and second write bank address signals BA_WT<1:2> have the second logic level combination. The fourth pulse generation circuit 1400 may generate the second internal write bank selection signal IALW<2> which is enabled to have a logic "high" level in synchronization with the internal write latch pulse ILPW if the first write bank address signal BA_WT<1> has a logic "high" level and the second write bank address signal BA_WT<2> has a logic "low" level. In an embodiment, the fourth pulse generation circuit 1400 may perform inversion, NAND operations, and perform a latching operation, and may include a combination of inverters, NAND logic gates, and a flip flop F/F as illustrated in FIG. 5.

Figure 6:
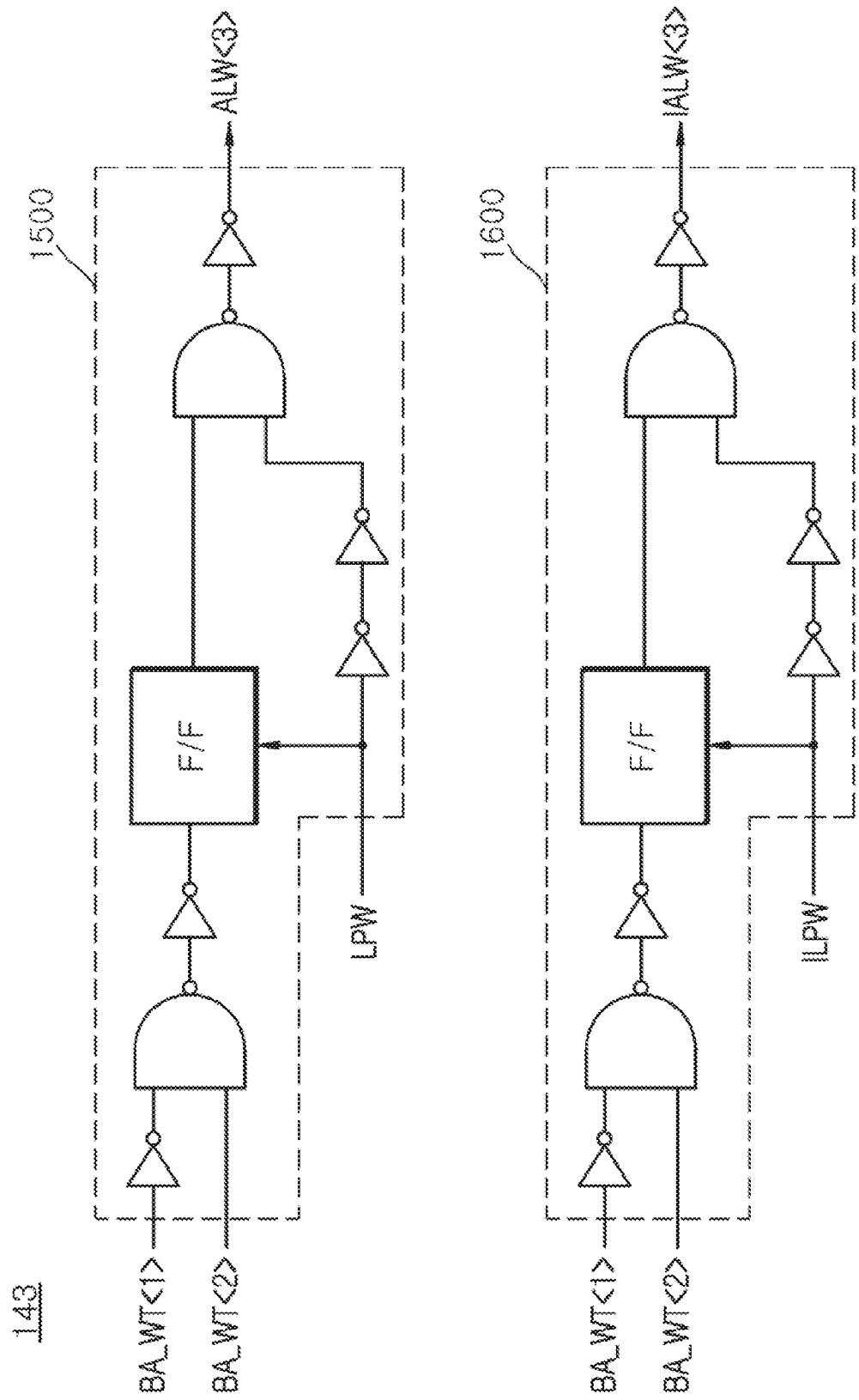
FIG. 6 is a circuit diagram illustrating a configuration of a third write bank selection signal generation circuit included in the write bank selection signal generation circuit of FIG. 3.

Referring to FIG. 6, the third write bank selection signal generation circuit 143 may include a fifth pulse generation circuit 1500 and a sixth pulse generation circuit 1600.

The fifth pulse generation circuit 1500 may generate the third write bank selection signal ALW<3> which is enabled to have a logic "high" level in synchronization with the write latch pulse LPW if the first and second write bank address signals BA_WT<1:2> have the third logic level combination. The fifth pulse generation circuit 1500 may generate the third write bank selection signal ALW<3> which is enabled to have a logic "high" level in synchronization with the write latch pulse LPW if the first write bank address signal BA_WT<1> has a logic "low" level and the second write bank address signal BA_WT<2> has a logic "high" level. In an embodiment, the fifth pulse generation circuit 1500 may perform inversion, NAND operations, and perform a latching operation, and may include a combination of inverters, NAND logic gates, and a flip flop F/F as illustrated in FIG. 6.

The sixth pulse generation circuit 1600 may generate the third internal write bank selection signal IALW<3> which is enabled to have a logic "high" level in synchronization with the internal write latch pulse ILPW if the first and second write bank address signals BA_WT<1:2> have the third logic level combination. The sixth pulse generation circuit 1600 may generate the third internal write bank selection signal IALW<3> which is enabled to have a logic "high" level in synchronization with the internal write latch pulse ILPW if the first write bank address signal BA_WT<1> has a logic "low" level and the second write bank address signal BA_WT<2> has a logic "high" level. In an embodiment, the sixth pulse generation circuit 1600 may perform inversion, NAND operations, and perform a latching operation, and may include a combination of inverters, NAND logic gates, and a flip flop F/F as illustrated in FIG. 6.

Figure 7:
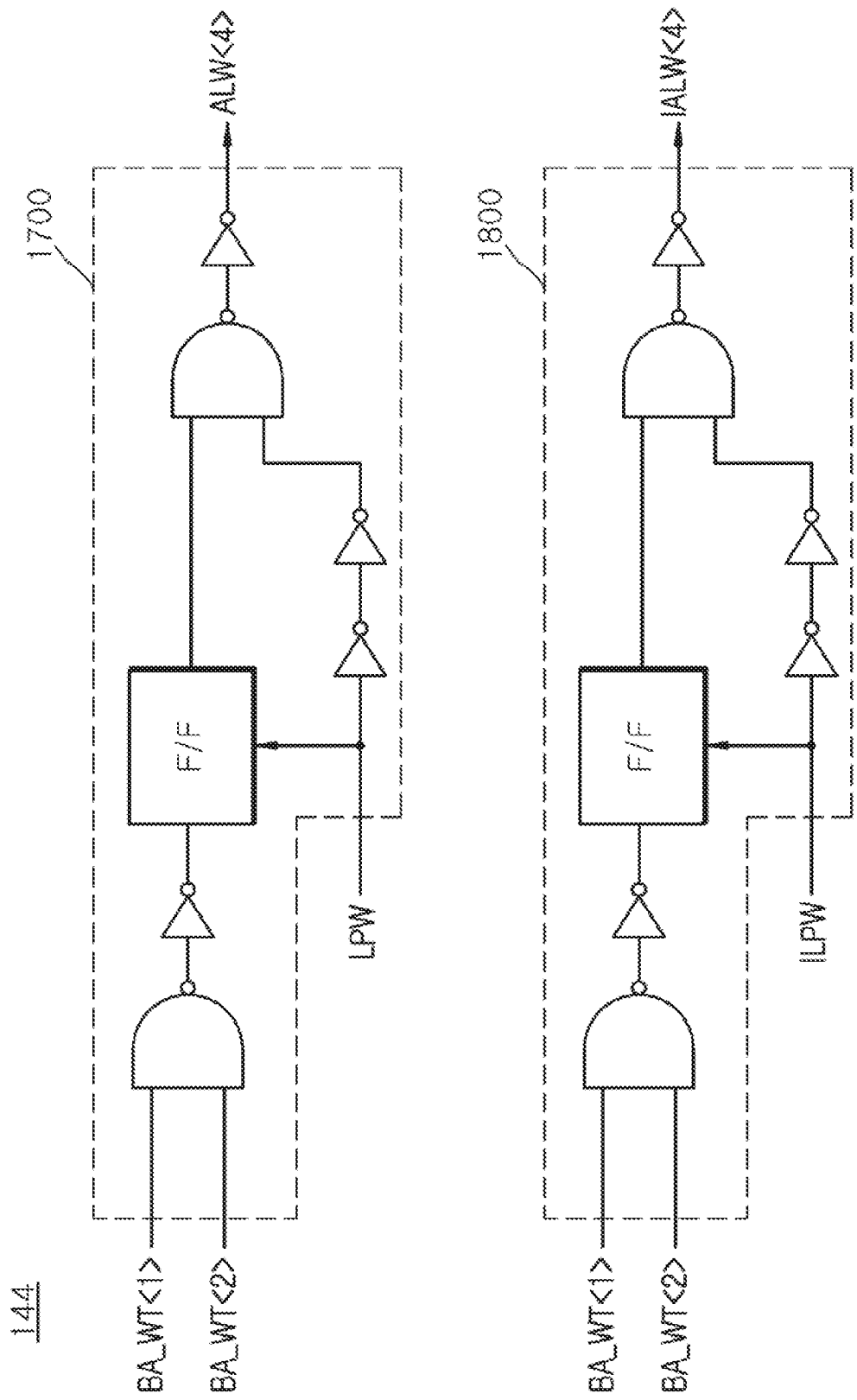
FIG. 7 is a circuit diagram illustrating a configuration of a fourth write bank selection signal generation circuit included in the write bank selection signal generation circuit of FIG. 3.

Referring to FIG. 7, the fourth write bank selection signal generation circuit 144 may include a seventh pulse generation circuit 1700 and an eighth pulse generation circuit 1800.

The seventh pulse generation circuit 1700 may generate the fourth write bank selection signal ALW<4> which is enabled to have a logic "high" level in synchronization with the write latch pulse LPW if the first and second write bank address signals BA_WT<1:2> have the fourth logic level combination. The seventh pulse generation circuit 1700 may generate the fourth write bank selection signal ALW<4> which is enabled to have a logic "high" level in synchronization with the write latch pulse LPW if the first write bank address signal BA_WT<1> has a logic "high" level and the second write bank address signal BA_WT<2> has a logic "high" level. In an embodiment, the seventh pulse generation circuit 1700 may perform inversion, NAND operations, and perform a latching operation, and may include a combination of inverters, NAND logic gates, and a flip flop F/F as illustrated in FIG. 7.

The eighth pulse generation circuit 1800 may generate the fourth internal write bank selection signal IALW<4> which is enabled to have a logic "high" level in synchronization with the internal write latch pulse ILPW if the first and second write bank address signals BA_WT<1:2> have the fourth logic level combination. The eighth pulse generation circuit 1800 may generate the fourth internal write bank selection signal IALW<4> which is enabled to have a logic "high" level in synchronization with the internal write latch pulse ILPW if the first write bank address signal BA_WT<1> has a logic "high" level and the second write bank address signal BA_WT<2> has a logic "high" level. In an embodiment, the eighth pulse generation circuit 1800 may perform inversion, NAND operations, and perform a latching operation, and may include a combination of inverters, NAND logic gates, and a flip flop F/F as illustrated in FIG. 7.

Figure 8:
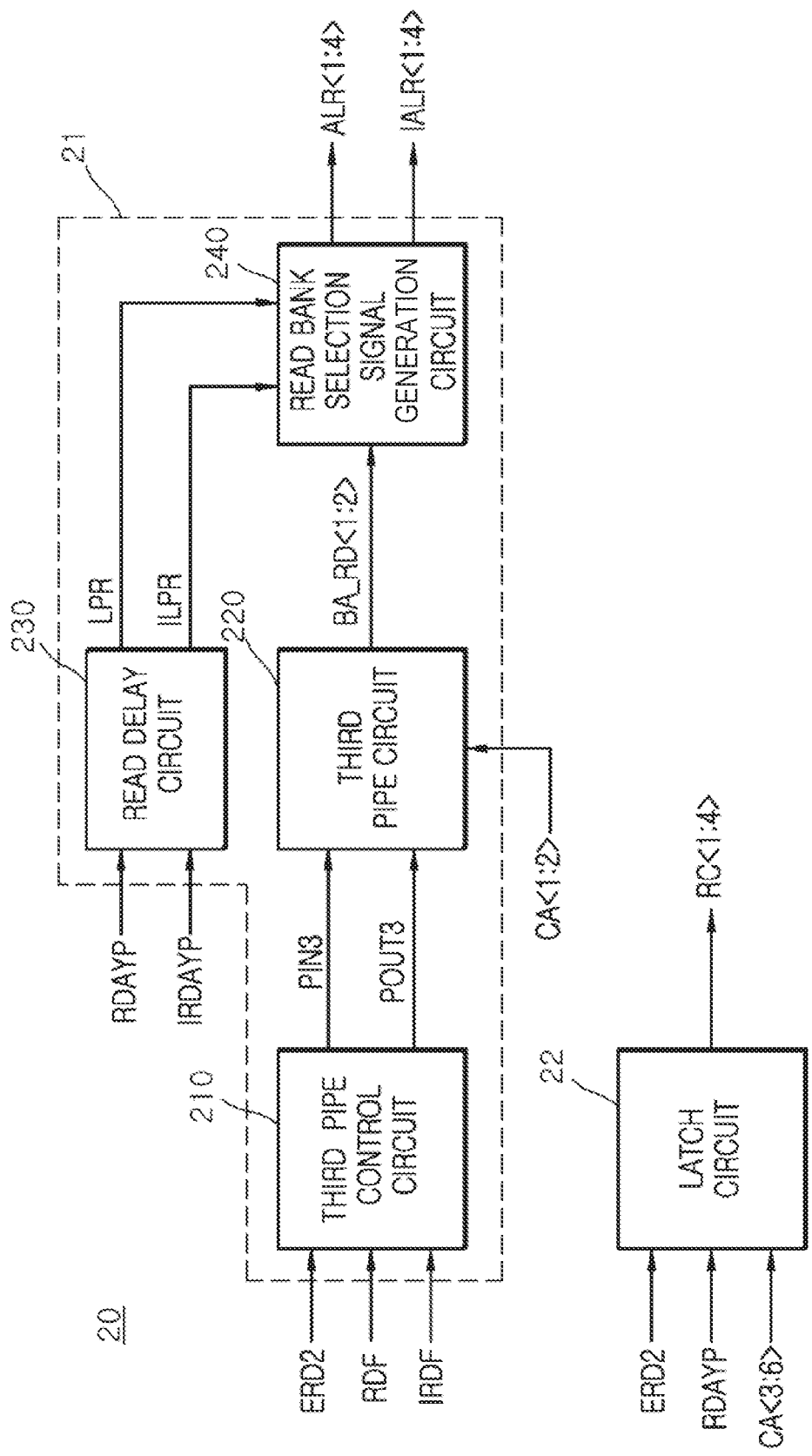
FIG. 8 is a block diagram illustrating a configuration of a read control circuit included in the semiconductor device of FIG. 1.

Referring to FIG. 8, the read control circuit 20 may include a read bank control circuit 21 and a latch circuit 22.

The read bank control circuit 21 may include a third pipe control circuit 210, a third pipe circuit 220, a read delay circuit 230 and a read bank selection signal generation circuit 240.

The third pipe control circuit 210 may generate a third input control signal PIN3 and a third output control signal POUT3 which is enabled in synchronization with the read flag signal RDF and the internal read flag signal IRDF if the second read command pulse ERD2 is inputted to the third pipe control circuit 210. The third pipe control circuit 210 may generate the third input control signal PIN3 and the third output control signal POUT3 which are enabled in synchronization with the read flag signal RDF if the second read command pulse ERD2 is inputted to the third pipe control circuit 210. The third pipe control circuit 210 may generate the third input control signal PIN3 and the third output control signal POUT3 which are enabled in synchronization with the internal read flag signal IRDF if the second read command pulse ERD2 is inputted to the third pipe control circuit 210.

The third pipe circuit 220 may be synchronized with the third input control signal PIN3 and the third output control signal POUT3 to generate first and second read bank address signals BA_RD<1:2> from the first and second command/address signals CA<1:2>. The third pipe circuit 220 may be synchronized with the third input control signal PIN3 to latch the first and second command/address signals CA<1:2> and may then be synchronized with the third output control signal POUT3 to output the latched signals of the first and second command/address signals CA<1:2> as the first and second read bank address signals BA_RD<1:2>. The first and second command/address signals CA<1:2> may be inputted to the third pipe circuit 220 in synchronization with a rising edge of the inverted internal clock signal ICLKB.

The read delay circuit 230 may delay the read column control pulse RDAYP and the internal read column control pulse IRDAYP by a predetermined period to generate a read latch pulse LPR and an internal read latch pulse ILPR. The read delay circuit 230 may delay the read column control pulse RDAYP by the predetermined period to generate the read latch pulse LPR. The read delay circuit 230 may delay the internal read column control pulse IRDAYP by the predetermined period to generate the internal read latch pulse ILPR. A delay time of the read delay circuit 230 for delaying the read column control pulse RDAYP and the internal read column control pulse IRDAYP may be set to be different according to the embodiments.

The read bank selection signal generation circuit 240 may be synchronized with the read latch pulse LPR to generate the first to fourth read bank selection signals ALR<1:4> from the first and second read bank address signals BA_RD<1:2> and may be synchronized with the internal read latch pulse ILPR to generate the first to fourth internal read bank selection signals IALR<1:4> from the first and second read bank address signals BA_RD<1:2>. The read bank selection signal generation circuit 240 may be synchronized with the read latch pulse LPR to generate the first to fourth read bank selection signals ALR<1:4>, one of which is selectively enabled according to a logic level combination of the first and second read bank address signals BA_RD<1:2>. The read bank selection signal generation circuit 240 may be synchronized with the internal read latch pulse ILPR to generate the first to fourth internal read bank selection signals IALR<1:4>, one of which is selectively enabled according to a logic level combination of the first and second read bank address signals BA_RD<1:2>.

The read bank control circuit 21 may latch the first and second command/address signals CA<1:2> in synchronization with the read flag signal RDF and the internal read flag signal IRDF if the second read command pulse ERD2 is enabled to perform the read operation. The read bank control circuit 21 may be synchronized with the read column control pulse RDAYP and the internal read column control pulse IRDAYP to generate the first to fourth read bank selection signals ALR<1:4> and the first to fourth internal read bank selection signals IALR<1:4> from the latched signals of the first and second command/address signals CA<1:2>.

The latch circuit 22 may generate the first to fourth read column address signals RC<1:4> from the third to sixth command/address signals CA<3:6> in synchronization with the read column control pulse RDAYP if the second read command pulse ERD2 is inputted to the latch circuit 22. If the second read command pulse ERD2 is inputted to the latch circuit 22, the latch circuit 22 may latch the third to sixth command/address signals CA<3:6> in synchronization with the read column control pulse RDAYP and may generate the first to fourth read column address signals RC<1:4> from the latched signals of the third to sixth command/address signals CA<3:6>. The third to sixth command/address signals CA<3:6> may be inputted to the latch circuit 22 in synchronization with a rising edge of the inverted internal clock signal ICLKB.

The read control circuit 20 may generate the first to fourth read bank selection signals ALR<1:4> and the first to fourth internal read bank selection signals IALR<1:4> from the first and second command/address signals CA<1:2> in synchronization with the read flag signal RDF and the internal read flag signal IRDF. The read control circuit 20 may generate the first to fourth read column address signals RC<1:4> from the third to sixth command/address signals CA<3:6> in synchronization with the read column control pulse RDAYP.

Figure 9:
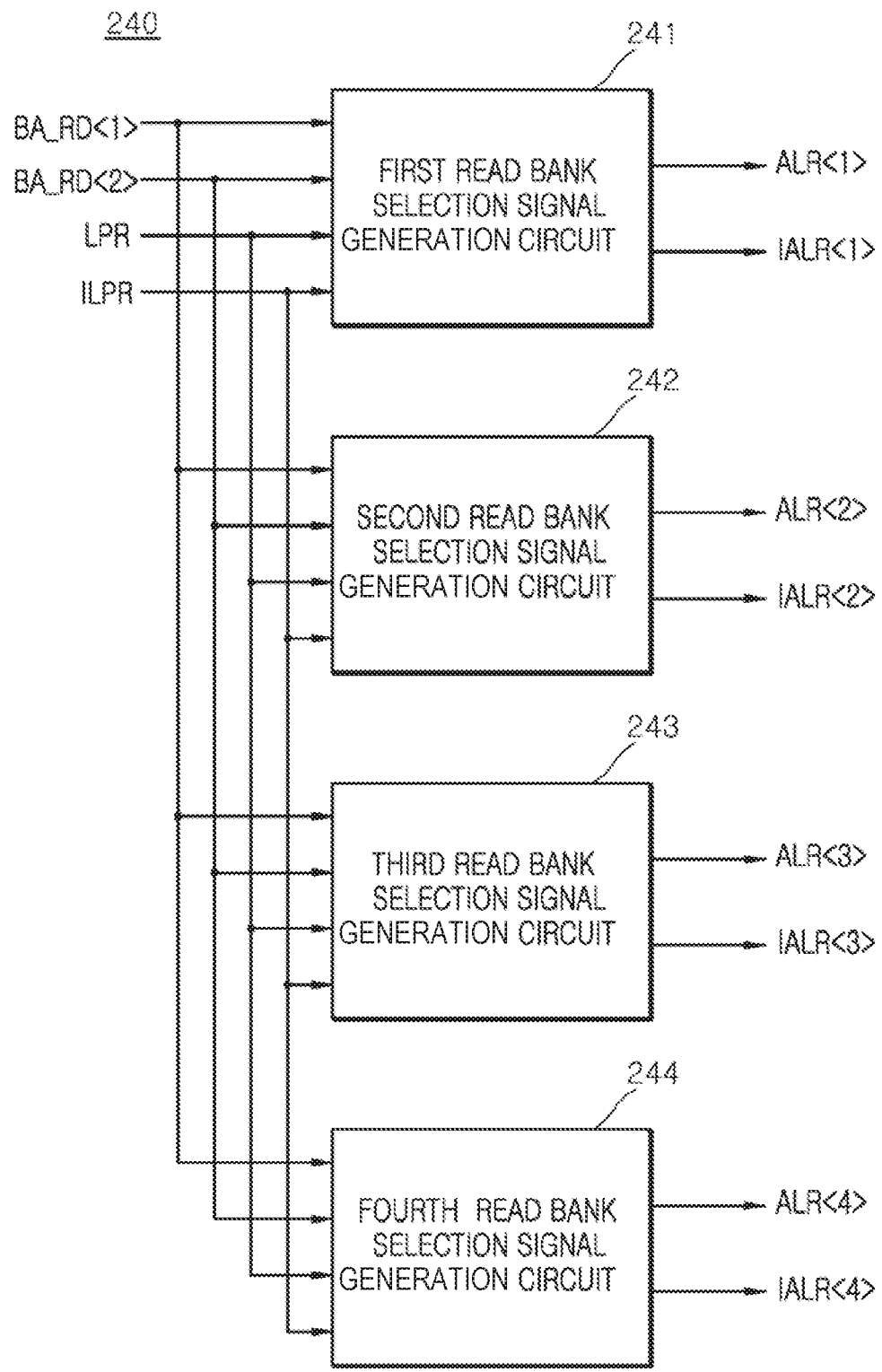
FIG. 9 is a block diagram illustrating a configuration of a read bank selection signal generation circuit included in the read control circuit of FIG. 8.

Referring to FIG. 9, the read bank selection signal generation circuit 240 may include a first read bank selection signal generation circuit 241, a second read bank selection signal generation circuit 242, a third read bank selection signal generation circuit 243 and a fourth read bank selection signal generation circuit 244.

The first read bank selection signal generation circuit 241 may generate the first read bank selection signal ALR<1> which is enabled in synchronization with the read latch pulse LPR if the first and second read bank address signals BA_RD<1:2> have a first logic level combination. The first read bank selection signal generation circuit 241 may generate the first internal read bank selection signal IALR<1> which is enabled in synchronization with the internal read latch pulse ILPR if the first and second read bank address signals BA_RD<1:2> have the first logic level combination. The first logic level combination of the first and second read bank address signals BA_RD<1:2> means that the first read bank address signal BA_RD<1> has a logic "low" level and the second read bank address signal BA_RD<2> has a logic "low" level.

The second read bank selection signal generation circuit 242 may generate the second read bank selection signal ALR<2> which is enabled in synchronization with the read latch pulse LPR if the first and second read bank address signals BA_RD<1:2> have a second logic level combination. The second read bank selection signal generation circuit 242 may generate the second internal read bank selection signal IALR<2> which is enabled in synchronization with the internal read latch pulse ILPR if the first and second read bank address signals BA_RD<1:2> have the second logic level combination. The second logic level combination of the first and second read bank address signals BA_RD<1:2> means that the first read bank address signal BA_RD<1> has a logic "high" level and the second read bank address signal BA_RD<2> has a logic "low" level.

The third read bank selection signal generation circuit 243 may generate the third read bank selection signal ALR<3> which is enabled in synchronization with the read latch pulse LPR if the first and second read bank address signals BA_RD<1:2> have a third logic level combination. The third read bank selection signal generation circuit 243 may generate the third internal read bank selection signal IALR<3> which is enabled in synchronization with the internal read latch pulse ILPR if the first and second read bank address signals BA_RD<1:2> have the third logic level combination. The third logic level combination of the first and second read bank address signals BA_RD<1:2> means that the first read bank address signal BA_RD<1> has a logic "low" level and the second read bank address signal BA_RD<2> has a logic "high" level.

The fourth read bank selection signal generation circuit 244 may generate the fourth read bank selection signal ALR<4> which is enabled in synchronization with the read latch pulse LPR if the first and second read bank address signals BA_RD<1:2> have a fourth logic level combination. The fourth read bank selection signal generation circuit 244 may generate the fourth internal read bank selection signal IALR<4> which is enabled in synchronization with the internal read latch pulse ILPR if the first and second read bank address signals BA_RD<1:2> have the fourth logic level combination. The fourth logic level combination of the first and second read bank address signals BA_RD<1:2> means that the first read bank address signal BA_RD<1> has a logic "high" level and the second read bank address signal BA_RD<2> has a logic "high" level.

Figure 10:
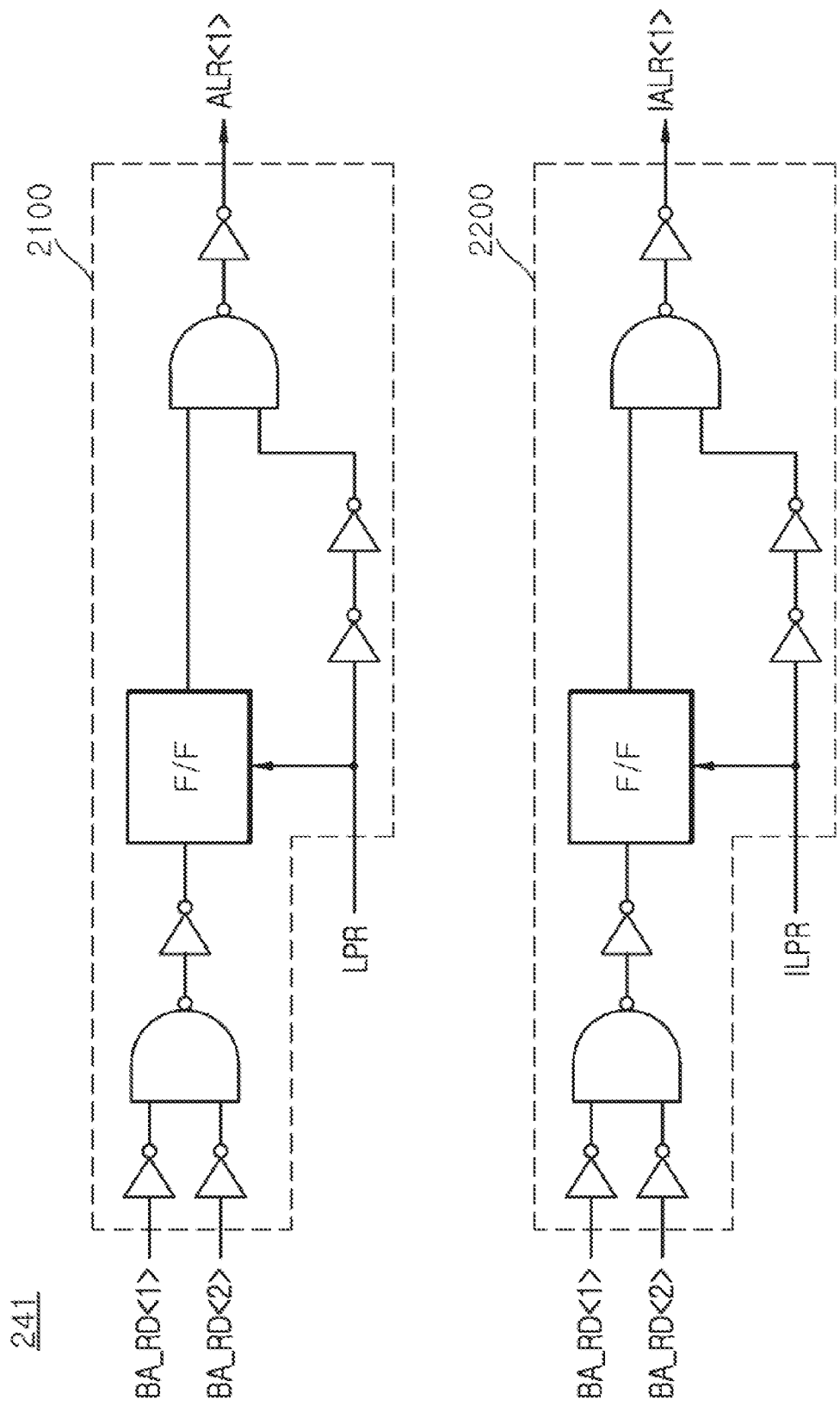
FIG. 10 is a circuit diagram illustrating a configuration of a first read bank selection signal generation circuit included in the read bank selection signal generation circuit of FIG. 9.

Referring to FIG. 10, the first read bank selection signal generation circuit 241 may include a ninth pulse generation circuit 2100 and a tenth pulse generation circuit 2200.

The ninth pulse generation circuit 2100 may generate the first read bank selection signal ALR<1> which is enabled to have a logic "high" level in synchronization with the read latch pulse LPR if the first and second read bank address signals BA_RD<1:2> have the first logic level combination. The ninth pulse generation circuit 2100 may generate the first read bank selection signal ALR<1> which is enabled to have a logic "high" level in synchronization with the read latch pulse LPR if the first read bank address signal BA_RD<1> has a logic "low" level and the second read bank address signal BA_RD<2> has a logic "low" level. In an embodiment, the ninth pulse generation circuit 2100 may perform inversion, NAND operations, and perform a latching operation, and may include a combination of inverters, NAND logic gates, and a flip flop F/F as illustrated in FIG. 10.

The tenth pulse generation circuit 2200 may generate the first internal read bank selection signal IALR<1> which is enabled to have a logic "high" level in synchronization with the internal read latch pulse ILPR if the first and second read bank address signals BA_RD<1:2> have the first logic level combination. The tenth pulse generation circuit 2200 may generate the first internal read bank selection signal IALR<1> which is enabled to have a logic "high" level in synchronization with the internal read latch pulse ILPR if the first read bank address signal BA_RD<1> has a logic "low" level and the second read bank address signal BA_RD<2> has a logic "low" level. In an embodiment, the tenth pulse generation circuit 2200 may perform inversion, NAND operations, and perform a latching operation, and may include a combination of inverters, NAND logic gates, and a flip flop F/F as illustrated in FIG. 10.

Figure 11:
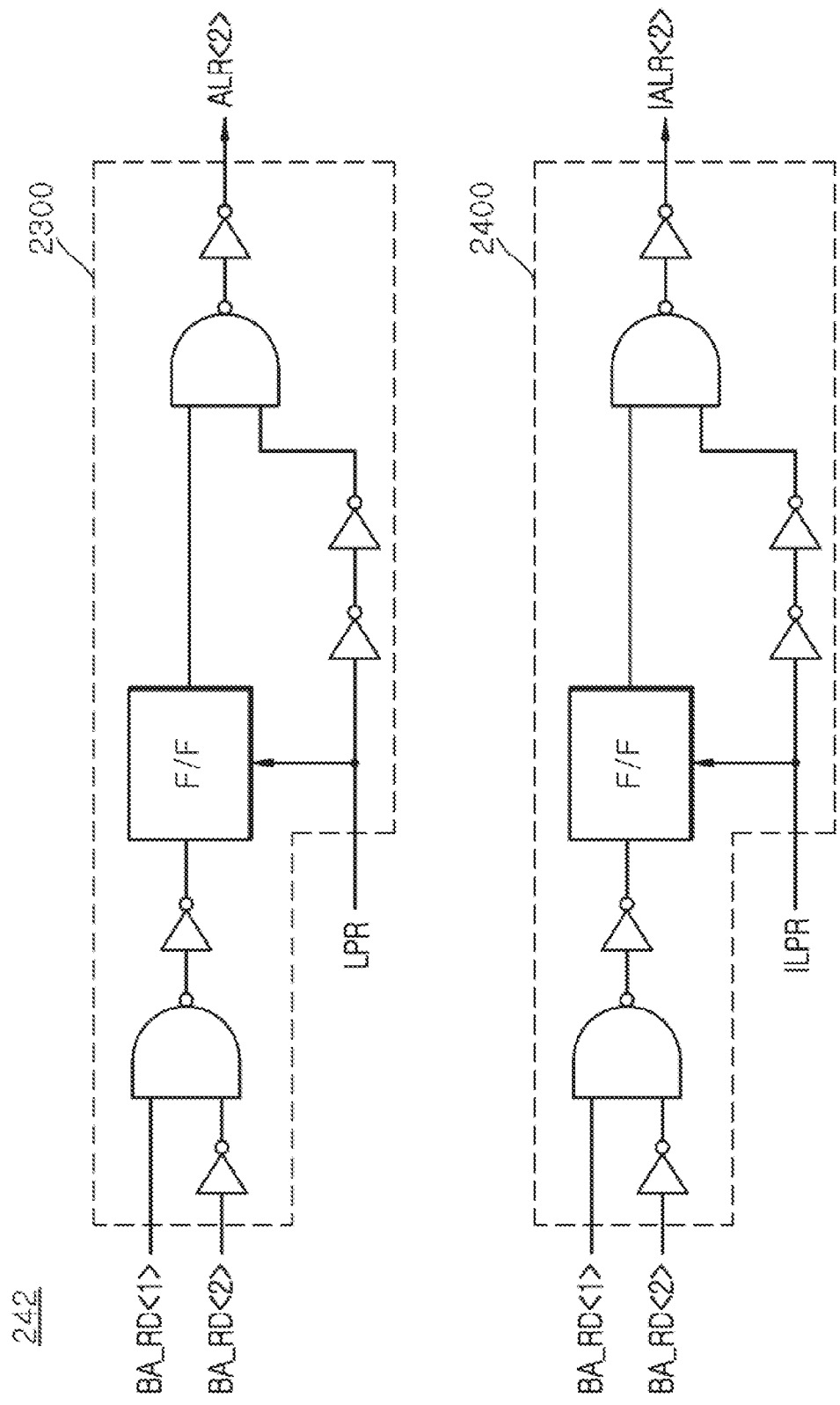
FIG. 11 is a circuit diagram illustrating a configuration of a second read bank selection signal generation circuit included in the read bank selection signal generation circuit of FIG. 9.

Referring to FIG. 11, the second read bank selection signal generation circuit 242 may include an eleventh pulse generation circuit 2300 and a twelfth pulse generation circuit 2400.

The eleventh pulse generation circuit 2300 may generate the second read bank selection signal ALR<2> which is enabled to have a logic "high" level in synchronization with the read latch pulse LPR if the first and second read bank address signals BA_RD<1:2> have the second logic level combination. The eleventh pulse generation circuit 2300 may generate the second read bank selection signal ALR<2> which is enabled to have a logic "high" level in synchronization with the read latch pulse LPR if the first read bank address signal BA_RD<1> has a logic "high" level and the second read bank address signal BA_RD<2> has a logic "low" level. In an embodiment, the eleventh pulse generation circuit 2300 may perform inversion, NAND operations, and perform a latching operation, and may include a combination of inverters, NAND logic gates, and a flip flop F/F as illustrated in FIG. 11.

The twelfth pulse generation circuit 2400 may generate the second internal read bank selection signal IALR<2> which is enabled to have a logic "high" level in synchronization with the internal read latch pulse ILPR if the first and second read bank address signals BA_RD<1:2> have the second logic level combination. The twelfth pulse generation circuit 2400 may generate the second internal read bank selection signal IALR<2> which is enabled to have a logic "high" level in synchronization with the internal read latch pulse ILPR if the first read bank address signal BA_RD<1> has a logic "high" level and the second read bank address signal BA_RD<2> has a logic "low" level. In an embodiment, the twelfth pulse generation circuit 2400 may perform inversion, NAND operations, and perform a latching operation, and may include a combination of inverters, NAND logic gates, and a flip flop F/F as illustrated in FIG. 11.

Figure 12:
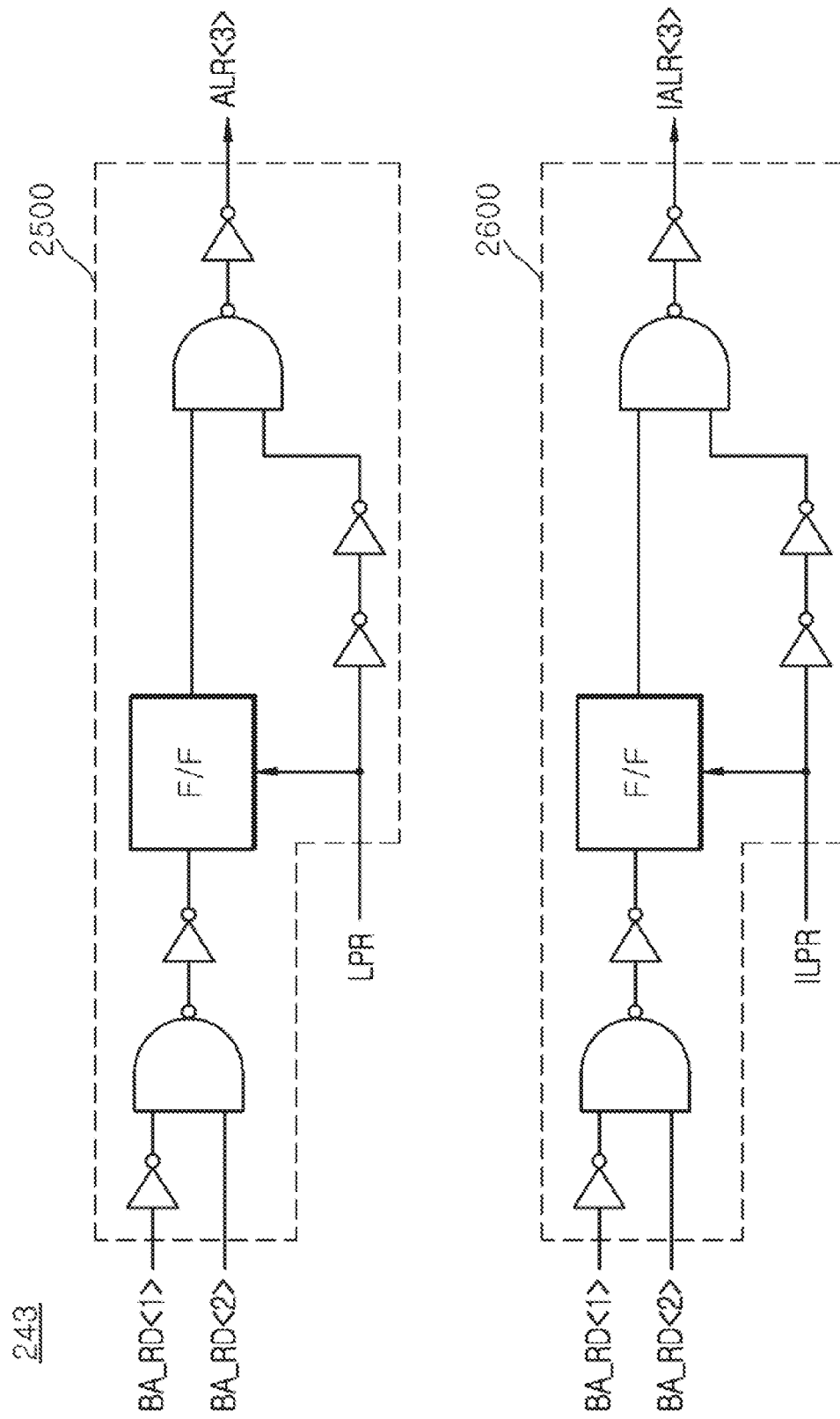
FIG. 12 is a circuit diagram illustrating a configuration of a third read bank selection signal generation circuit included in the read bank selection signal generation circuit of FIG. 9.

Referring to FIG. 12, the third read bank selection signal generation circuit 243 may include a thirteenth pulse generation circuit 2500 and a fourteenth pulse generation circuit 2600.

The thirteenth pulse generation circuit 2500 may generate the third read bank selection signal ALR<3> which is enabled to have a logic "high" level in synchronization with the read latch pulse LPR if the first and second read bank address signals BA_RD<1:2> have the third logic level combination. The thirteenth pulse generation circuit 2500 may generate the third read bank selection signal ALR<3> which is enabled to have a logic "high" level in synchronization with the read latch pulse LPR if the first read bank address signal BA_RD<1> has a logic "low" level and the second read bank address signal BA_RD<2> has a logic "high" level. In an embodiment, the thirteenth pulse generation circuit 2500 may perform inversion, NAND operations, and perform a latching operation, and may include a combination of inverters, NAND logic gates, and a flip flop F/F as illustrated in FIG. 12.

The fourteenth pulse generation circuit 2600 may generate the third internal read bank selection signal IALR<3> which is enabled to have a logic "high" level in synchronization with the internal read latch pulse ILPR if the first and second read bank address signals BA_RD<1:2> have the third logic level combination. The fourteenth pulse generation circuit 2600 may generate the third internal read bank selection signal IALR<3> which is enabled to have a logic "high" level in synchronization with the internal read latch pulse ILPR if the first read bank address signals BA_RD<1> has a logic "low" level and the second read bank address signals BA_RD<2> has a logic "high" level. In an embodiment, the fourteenth pulse generation circuit 2600 may perform inversion, NAND operations, and perform a latching operation, and may include a combination of inverters, NAND logic gates, and a flip flop F/F as illustrated in FIG. 12.

Figure 13:
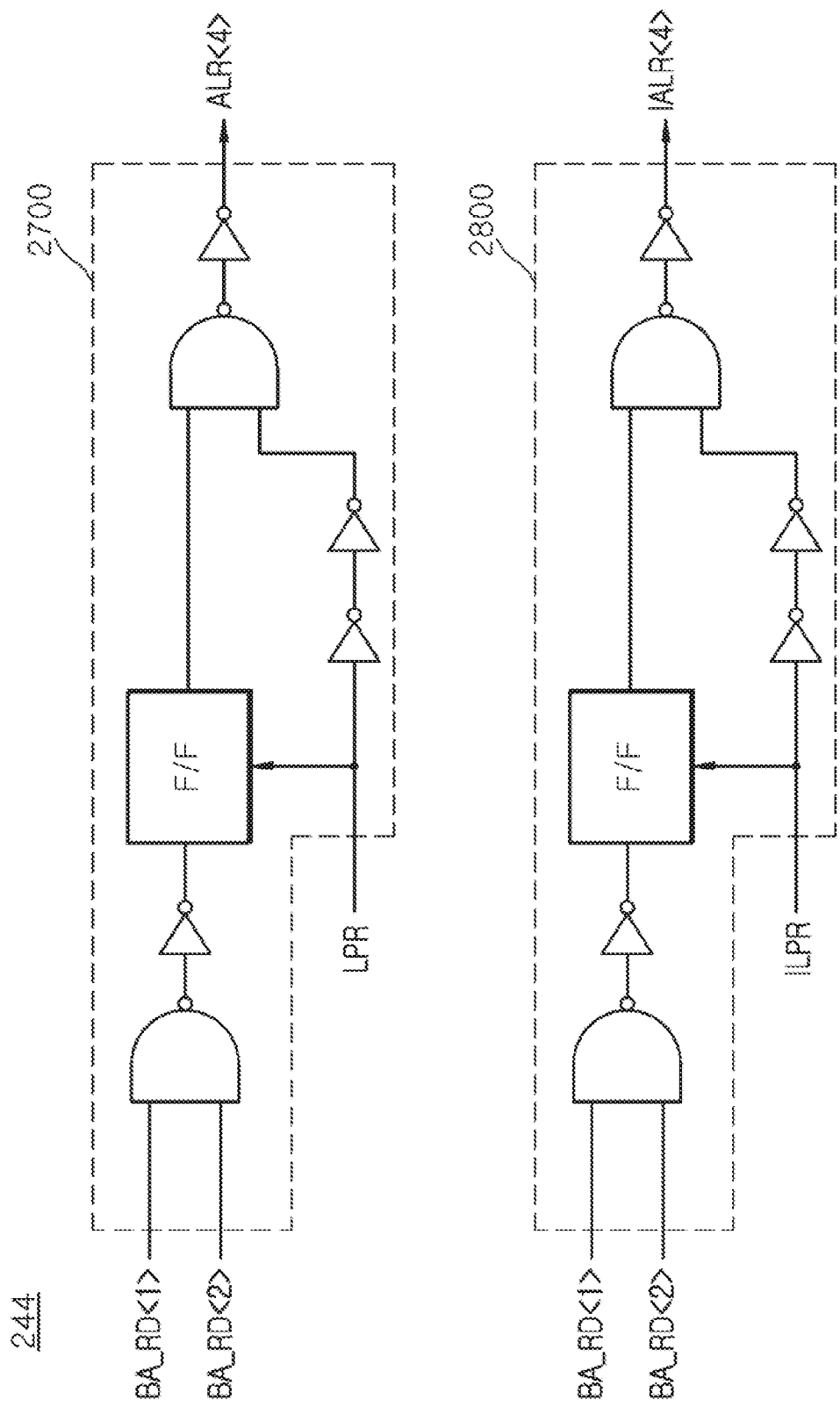
FIG. 13 is a circuit diagram illustrating a configuration of a fourth read bank selection signal generation circuit included in the read bank selection signal generation circuit of FIG. 9.

Referring to FIG. 13, the fourth read bank selection signal generation circuit 244 may include a fifteenth pulse generation circuit 2700 and a sixteenth pulse generation circuit 2800.

The fifteenth pulse generation circuit 2700 may generate the fourth read bank selection signal ALR<4> which is enabled to have a logic "high" level in synchronization with the read latch pulse LPR if the first and second read bank address signals BA_RD<1:2> have the fourth logic level combination. The fifteenth pulse generation circuit 2700 may generate the fourth read bank selection signal ALR<4> which is enabled to have a logic "high" level in synchronization with the read latch pulse LPR if the first read bank address signals BA_RD<1> has a logic "high" level and the second read bank address signals BA_RD<2> has a logic "high" level. In an embodiment, the fifteenth pulse generation circuit 2700 may perform inversion, NAND operations, and perform a latching operation, and may include a combination of inverters, NAND logic gates, and a flip flop F/F as illustrated in FIG. 13.

The sixteenth pulse generation circuit 2800 may generate the fourth internal read bank selection signal IALR<4> which is enabled to have a logic "high" level in synchronization with the internal read latch pulse ILPR if the first and second read bank address signals BA_RD<1:2> have the fourth logic level combination. The sixteenth pulse generation circuit 2800 may generate the fourth internal read bank selection signal IALR<4> which is enabled to have a logic "high" level in synchronization with the internal read latch pulse ILPR if the first read bank address signals BA_RD<1> has a logic "high" level and the second read bank address signals BA_RD<2> has a logic "high" level. In an embodiment, the sixteenth pulse generation circuit 2800 may perform inversion, NAND operations, and perform a latching operation, and may include a combination of inverters, NAND logic gates, and a flip flop F/F as illustrated in FIG. 13.

Figure 14:
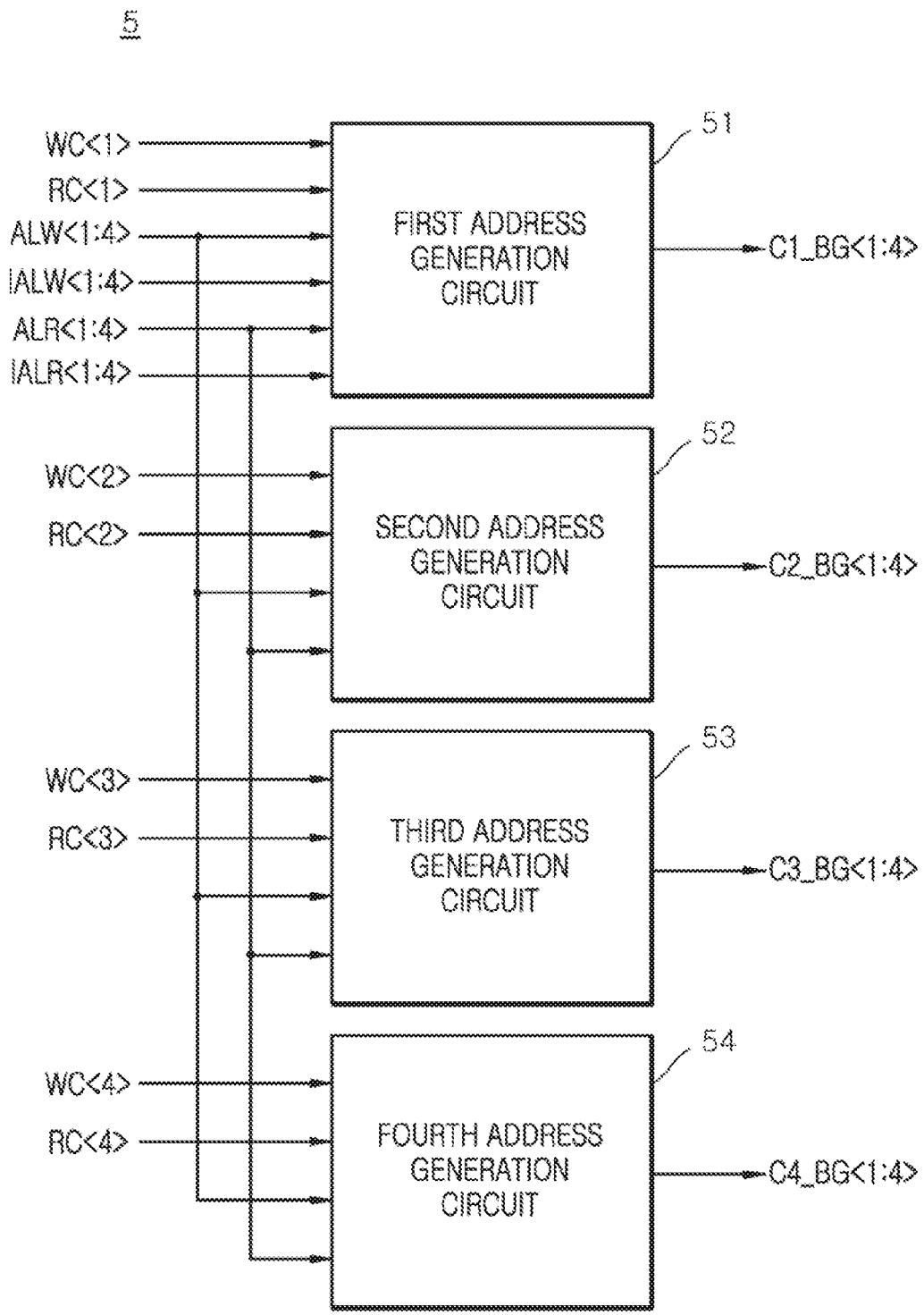
FIG. 14 is a block diagram illustrating a configuration of an address generation circuit included in the semiconductor device of FIG. 1.

Referring to FIG. 14, the address generation circuit 5 may include a first address generation circuit 51, a second address generation circuit 52, a third address generation circuit 53 and a fourth address generation circuit 54.

The first address generation circuit 51 may be synchronized with the first to fourth write bank selection signals ALW<1:4> and the first to fourth internal write bank selection signals IALW<1:4> to output the first write column address signal WC<1> as one of the first to fourth bank group address signals C1_BG<1:4>. The first address generation circuit 51 may be synchronized with the first to fourth read bank selection signals ALR<1:4> and the first to fourth internal read bank selection signals IALR<1:4> to output the first read column address signal RC<1> as one of the first to fourth bank group address signals C1_BG<1:4>.

The second address generation circuit 52 may be synchronized with the first to fourth write bank selection signals ALW<1:4> to output the second write column address signal WC<2> as one of the first to fourth bank group address signals C2_BG<1:4>. The second address generation circuit 52 may be synchronized with the first to fourth read bank selection signals ALR<1:4> to output the second read column address signal RC<2> as one of the first to fourth bank group address signals C2_BG<1:4>.

The third address generation circuit 53 may be synchronized with the first to fourth write bank selection signals ALW<1:4> to output the third write column address signal WC<3> as one of the first to fourth bank group address signals C3_BG<1:4>. The third address generation circuit 53 may be synchronized with the first to fourth read bank selection signals ALR<1:4> to output the third read column address signal RC<3> as one of the first to fourth bank group address signals C3_BG<1:4>.

The fourth address generation circuit 54 may be synchronized with the first to fourth write bank selection signals ALW<1:4> to output the fourth write column address signal WC<4> as one of the first to fourth bank group address signals C4_BG<1:4>. The fourth address generation circuit 54 may be synchronized with the first to fourth read bank selection signals ALR<1:4> to output the fourth read column address signal RC<4> as one of the first to fourth bank group address signals C4_BG<1:4>.

Figure 15:
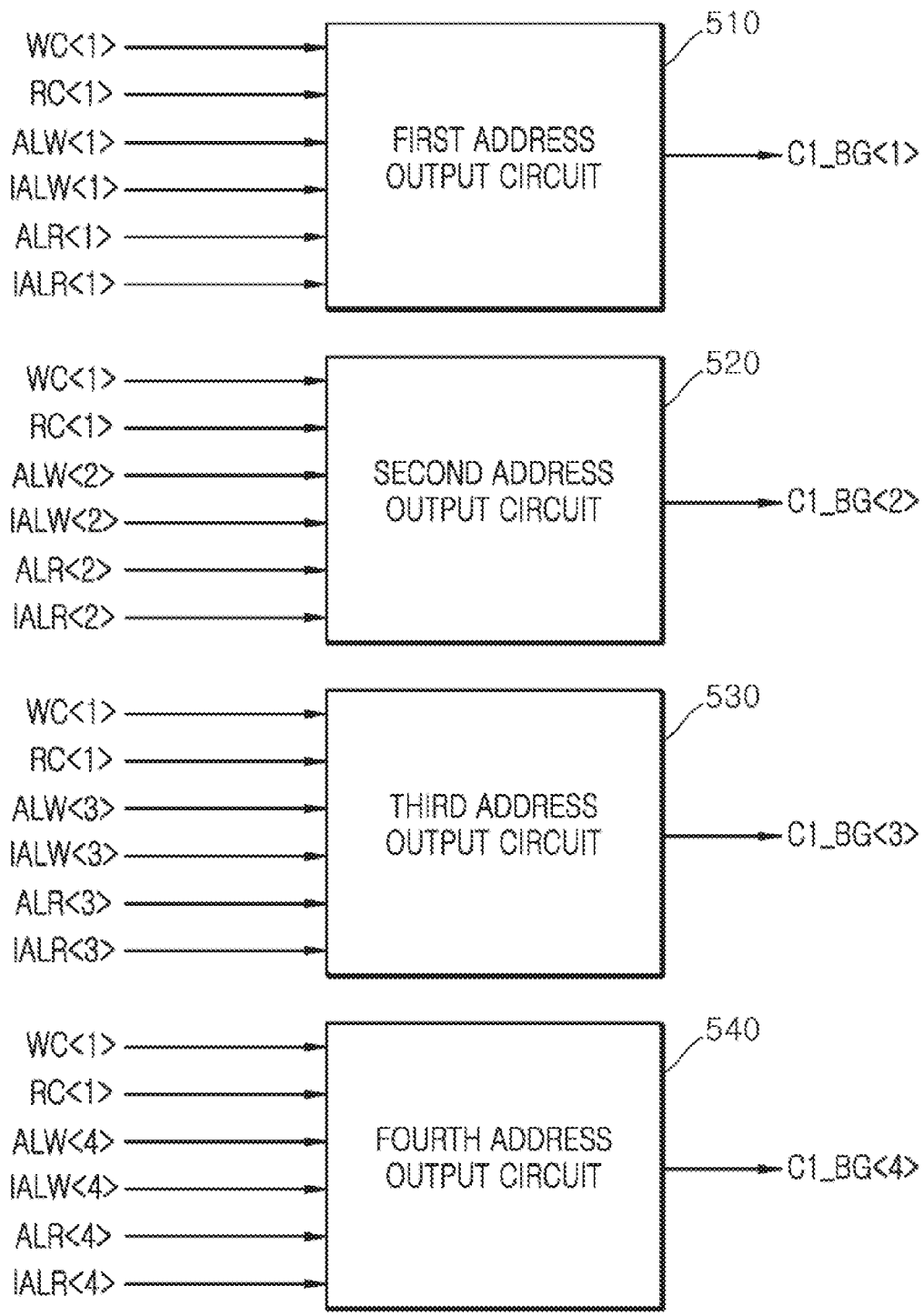
FIG. 15 is a block diagram illustrating a configuration of a first address generation circuit included in the address generation circuit of FIG. 14.

Referring to FIG. 15, the first address generation circuit 51 may include a first address output circuit 510, a second address output circuit 520, a third address output circuit 530 and a fourth address output circuit 540.

The first address output circuit 510 may buffer the first write column address signal WC<1> to output the buffered signal of the first write column address signal WC<1> as the first bit C1_BG<1> of the first bank group address signals C1_BG<1>, C2_BG<1>, C3_BG<1> and C4_BG<1>, if the first write bank selection signal ALW<1> is enabled. The first address output circuit 510 may inversely buffer the first write column address signal WC<1> to output the inversely buffered signal of the first write column address signal WC<1> as the first bit C1_BG<1> of the first bank group address signals C1_BG<1>, C2_BG<1>, C3_BG<1> and C4_BG<1>, if the first internal write bank selection signal IALW<1> is enabled. The first address output circuit 510 may buffer the first read column address signal RC<1> to output the buffered signal of the first read column address signal RC<1> as the first bit C1_BG<1> of the first bank group address signals C1_BG<1>, C2_BG<1>, C3_BG<1> and C4_BG<1>, if the first read bank selection signal ALR<1> is enabled. The first address output circuit 510 may inversely buffer the first read column address signal RC<1> to output the inversely buffered signal of the first read column address signal RC<1> as the first bit C1_BG<1> of the first bank group address signals C1_BG<1>, C2_BG<1>, C3_BG<1> and C4_BG<1>, if the first internal read bank selection signal IALR<1> is enabled.

The second address output circuit 520 may buffer the first write column address signal WC<1> to output the buffered signal of the first write column address signal WC<1> as the first bit C1_BG<2> of the second bank group address signals C1_BG<2>, C2_BG<2>, C3_BG<2> and C4_BG<2>, if the second write bank selection signal ALW<2> is enabled. The second address output circuit 520 may inversely buffer the first write column address signal WC<1> to output the inversely buffered signal of the first write column address signal WC<1> as the first bit C1_BG<2> of the second bank group address signals C1_BG<2>, C2_BG<2>, C3_BG<2> and C4_BG<2>, if the second internal write bank selection signal IALW<2> is enabled. The second address output circuit 520 may buffer the first read column address signal RC<1> to output the buffered signal of the first read column address signal RC<1> as the first bit C1_BG<2> of the second bank group address signals C1_BG<2>, C2_BG<2>, C3_BG<2> and C4_BG<2>, if the second read bank selection signal ALR<2> is enabled. The second address output circuit 520 may inversely buffer the first read column address signal RC<1> to output the inversely buffered signal of the first read column address signal RC<1> as the first bit C1_BG<2> of the second bank group address signals C1_BG<2>, C2_BG<2>, C3_BG<2> and C4_BG<2>, if the second internal read bank selection signal IALR<2> is enabled.

The third address output circuit 530 may buffer the first write column address signal WC<1> to output the buffered signal of the first write column address signal WC<1> as the first bit C1_BG<3> of the third bank group address signals C1_BG<3>, C2_BG<3>, C3_BG<3> and C4_BG<3>, if the third write bank selection signal ALW<3> is enabled. The third address output circuit 530 may inversely buffer the first write column address signal WC<1> to output the inversely buffered signal of the first write column address signal WC<1> as the first bit C1_BG<3> of the third bank group address signals C1_BG<3>, C2_BG<3>, C3_BG<3> and C4_BG<3>, if the third internal write bank selection signal IALW<3> is enabled. The third address output circuit 530 may buffer the first read column address signal RC<1> to output the buffered signal of the first read column address signal RC<1> as the first bit C1_BG<3> of the third bank group address signals C1_BG<3>, C2_BG<3>, C3_BG<3> and C4_BG<3>, if the third read bank selection signal ALR<3> is enabled. The third address output circuit 530 may inversely buffer the first read column address signal RC<1> to output the inversely buffered signal of the first read column address signal RC<1> as the first bit C1_BG<3> of the third bank group address signals C1_BG<3>, C2_BG<3>, C3_BG<3> and C4_BG<3>, if the third internal read bank selection signal IALR<3> is enabled.

The fourth address output circuit 540 may buffer the first write column address signal WC<1> to output the buffered signal of the first write column address signal WC<1> as the first bit C1_BG<4> of the fourth bank group address signals C1_BG<4>, C2_BG<4>, C3_BG<4> and C4_BG<4>, if the fourth write bank selection signal ALW<4> is enabled. The fourth address output circuit 540 may inversely buffer the first write column address signal WC<1> to output the inversely buffered signal of the first write column address signal WC<1> as the first bit C1_BG<4> of the fourth bank group address signals C1_BG<4>, C2_BG<4>, C3_BG<4> and C4_BG<4>, if the fourth internal write bank selection signal IALW<4> is enabled. The fourth address output circuit 540 may buffer the first read column address signal RC<1> to output the buffered signal of the first read column address signal RC<1> as the first bit C1_BG<4> of the fourth bank group address signals C1_BG<4>, C2_BG<4>, C3_BG<4> and C4_BG<4>, if the fourth read bank selection signal ALR<4> is enabled. The fourth address output circuit 540 may inversely buffer the first read column address signal RC<1> to output the inversely buffered signal of the first read column address signal RC<1> as the first bit C1_BG<4> of the fourth bank group address signals C1_BG<4>, C2_BG<4>, C3_BG<4> and C4_BG<4>, if the fourth internal read bank selection signal IALR<4> is enabled.

Figure 16:
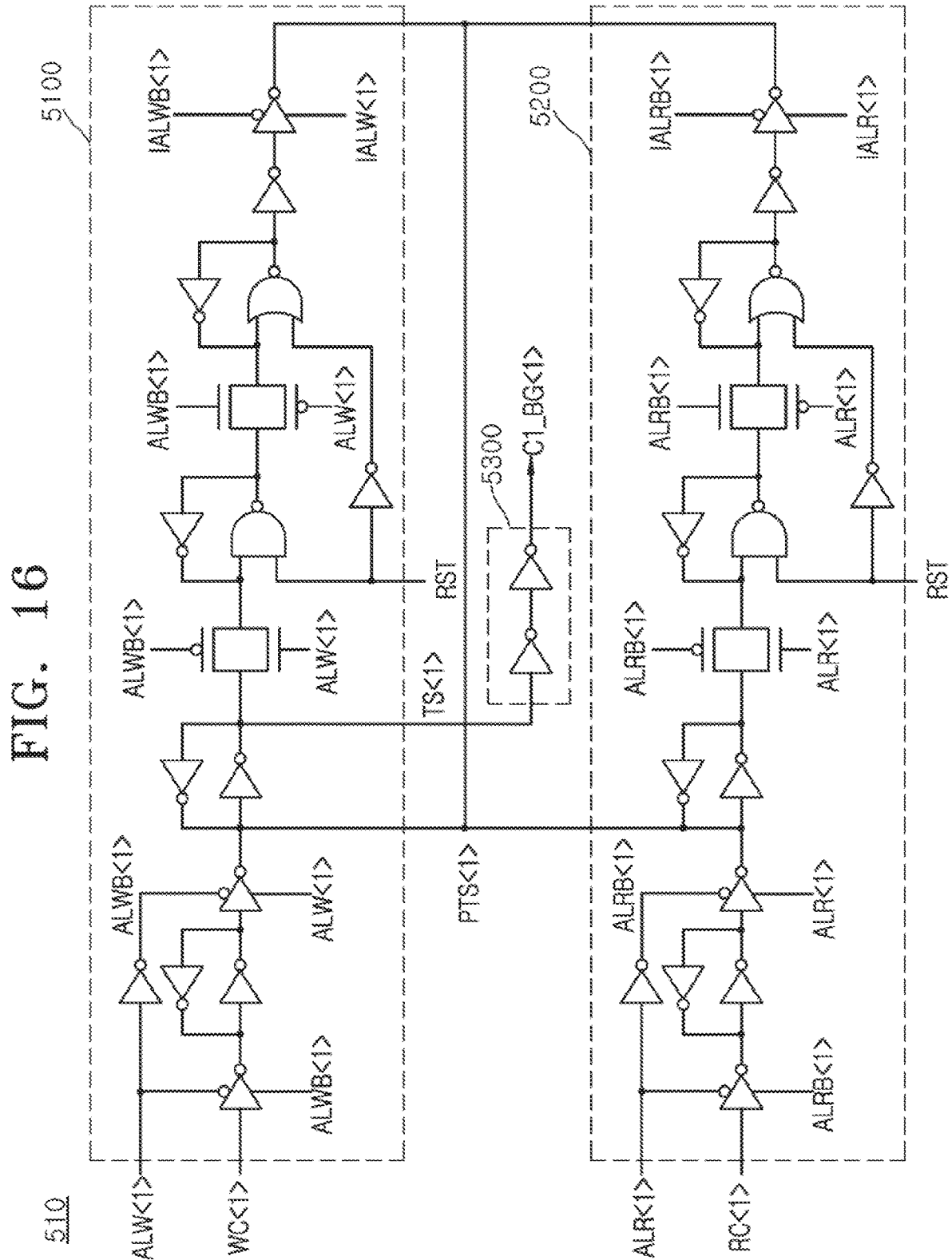
FIG. 16 is a circuit diagram illustrating a configuration of a first address output circuit included in the first address generation circuit of FIG. 15.

Referring to FIG. 16, the first address output circuit 510 may include a first signal transmission circuit 5100, a second signal transmission circuit 5200 and a first buffer circuit 5300.

The first signal transmission circuit 5100 may receive the first write column address signal WC<1> if the first write bank selection signal ALW<1> has a logic "low" level. The first signal transmission circuit 5100 may latch the first write column address signal WC<1> inputted to the first signal transmission circuit 5100 and may buffer the latched signal of the first write column address signal WC<1> to generate a first transmission signal TS<1> if the first write bank selection signal ALW<1> has a logic "high" level. The first signal transmission circuit 5100 may buffer the first transmission signal TS<1> to generate a first pre-transmission signal PTS<1> if the first internal write bank selection signal IALW<1> has a logic "high" level and may inversely buffer the first pre-transmission signal PTS<1> to generate the first transmission signal TS<1> regardless of the first internal write bank selection signal IALW<1>. The first signal transmission circuit 5100 may generate the first pre-transmission signal PTS<1> which is initialized to have a logic "low" level if a reset signal RST is enabled to have a logic "low" level and the first internal write bank selection signal IALW<1> has a logic "high" level. The reset signal RST may be set as a signal which is enabled to perform an initialization operation of the semiconductor device. In an embodiment, the first signal transmission circuit 5100 may also receive a complementary first write bank selection signal ALWB<1> and a complementary first internal write bank selection signal IALWB<1>.

The second signal transmission circuit 5200 may receive the first read column address signal RC<1> if the first read bank selection signal ALR<1> has a logic "low" level. The second signal transmission circuit 5200 may latch the first read column address signal RC<1> inputted to the second signal transmission circuit 5200 and may inversely buffer the latched signal of the first read column address signal RC<1> to generate the first pre-transmission signal PTS<1> if the first read bank selection signal ALR<1> has a logic "high" level. The second signal transmission circuit 5200 may invert the first pre-transmission signal PTS<1> if the first internal read bank selection signal IALR<1> has a logic "high" level. The second signal transmission circuit 5200 may generate the first pre-transmission signal PTS<1> which is initialized to have a logic "low" level if the reset signal RST is enabled to have a logic "low" level. In an embodiment, the second signal transmission circuit 5200 may also receive a complementary first read bank selection signal ALRB<1> and a complementary first internal read bank selection signal IALRB<1>.

The buffer circuit 5300 may buffer the first transmission signal TS<1> to output the buffered signal of the first transmission signal TS<1> as the first bit C1_BG<1> of the first bank group address signals C1_BG<1>, C2_BG<1>, C3_BG<1> and C4_BG<1>.

Each of the second to fourth address output circuits 520, 530 and 540 illustrated in FIG. 15 may be realized using substantially the same circuit as the first output circuit 510 illustrated in FIG. 16 except its input/output (I/O) signals. Thus, descriptions of the second to fourth address output circuits 520, 530 and 540 will be omitted hereinafter.

Figure 17:
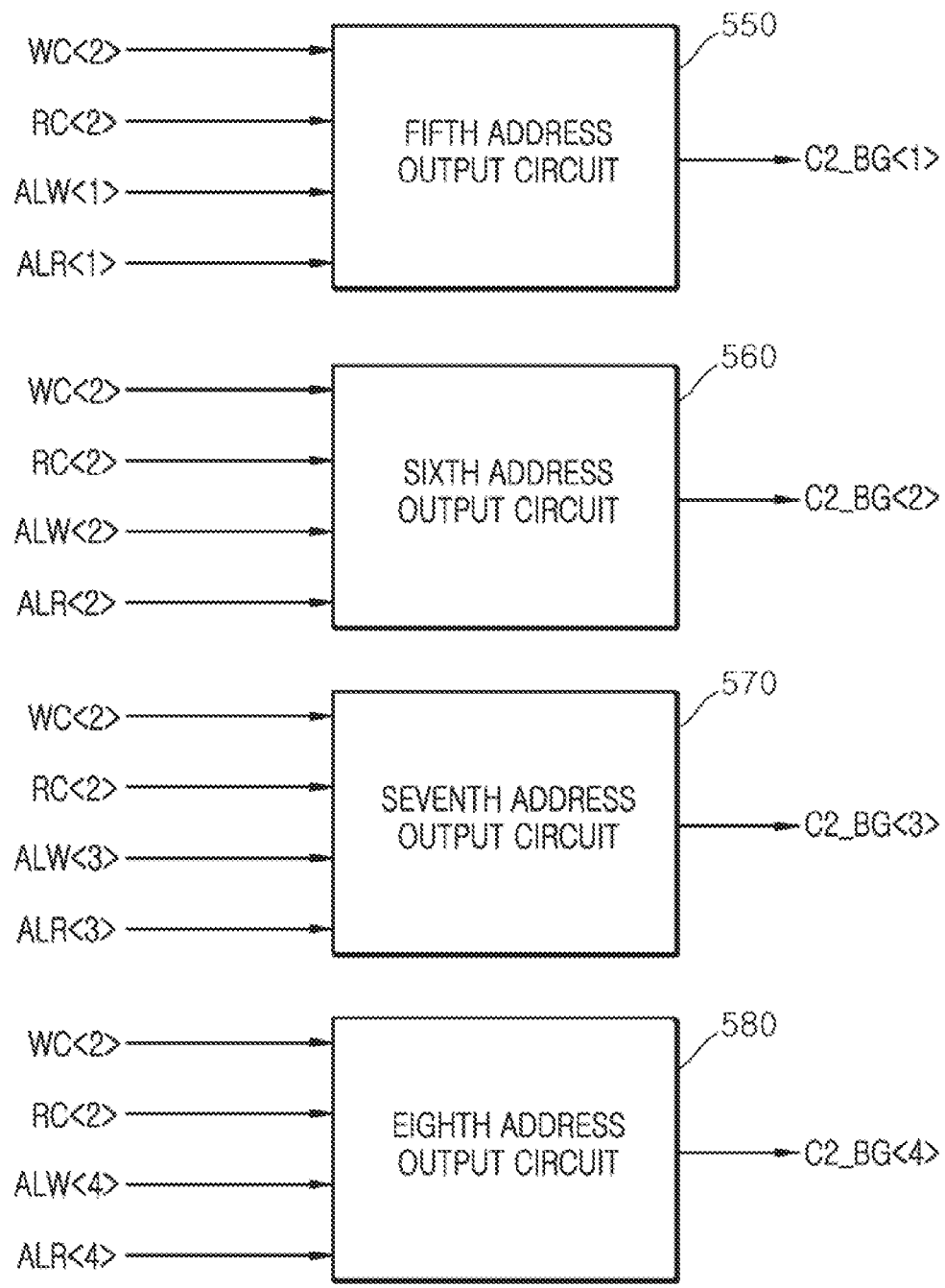
FIG. 17 is a block diagram illustrating a configuration of a second address generation circuit included in the address generation circuit of FIG. 14.

Referring to FIG. 17, the second address generation circuit 52 may include a fifth address output circuit 550, a sixth address output circuit 560, a seventh address output circuit 570 and an eighth address output circuit 580.

The fifth address output circuit 550 may output the second write column address signal WC<2> as the second bit C2_BG<1> of the first bank group address signals C1_BG<1>, C2_BG<1>, C3_BG<1> and C4_BG<1>, if the first write bank selection signal ALW<1> is enabled. The fifth address output circuit 550 may output the second read column address signal RC<2> as the second bit C2_BG<1> of the first bank group address signals C1_BG<1>, C2_BG<1>, C3_BG<1> and C4_BG<1>, if the first read bank selection signal ALR<1> is enabled.

The sixth address output circuit 560 may output the second write column address signal WC<2> as the second bit C2_BG<2> of the second bank group address signals C1_BG<2>, C2_BG<2>, C3_BG<2> and C4_BG<2>, if the second write bank selection signal ALW<2> is enabled. The sixth address output circuit 560 may output the second read column address signal RC<2> as the second bit C2_BG<2> of the second bank group address signals C1_BG<2>, C2_BG<2>, C3_BG<2> and C4_BG<2>, if the second read bank selection signal ALR<2> is enabled.

The seventh address output circuit 570 may output the second write column address signal WC<2> as the second bit C2_BG<3> of the third bank group address signals C1_BG<3>, C2_BG<3>, C3_BG<3> and C4_BG<3>, if the third write bank selection signal ALW<3> is enabled. The seventh address output circuit 570 may output the second read column address signal RC<2> as the second bit C2_BG<3> of the third bank group address signals C1_BG<3>, C2_BG<3>, C3_BG<3> and C4_BG<3>, if the third read bank selection signal ALR<3> is enabled.

The eighth address output circuit 580 may output the second write column address signal WC<2> as the second bit C2_BG<4> of the fourth bank group address signals C1_BG<4>, C2_BG<4>, C3_BG<4> and C4_BG<4>, if the fourth write bank selection signal ALW<4> is enabled. The eighth address output circuit 580 may output the second read column address signal RC<2> as the second bit C2_BG<4> of the fourth bank group address signals C1_BG<4>, C2_BG<4>, C3_BG<4> and C4_BG<4>, if the fourth read bank selection signal ALR<4> is enabled.

Each of the third and fourth address generation circuits 53 and 54 illustrated in FIG. 14 may be realized using substantially the same circuit as the second address generation circuit 52 illustrated in FIG. 17 except its input/output (I/O) signals. Thus, descriptions of the third and fourth address generation circuits 53 and 54 will be omitted hereinafter.

Figure 18:
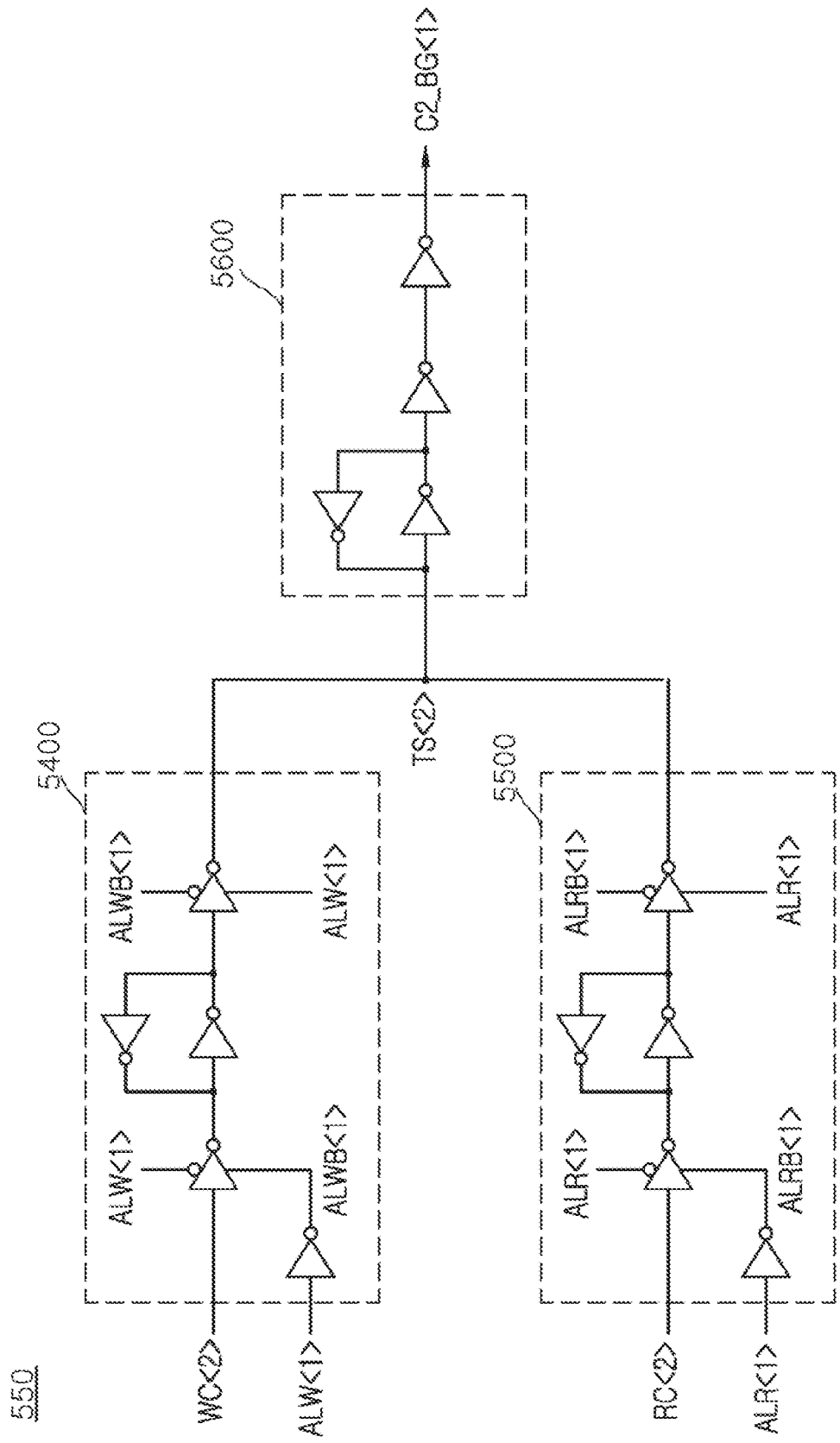
FIG. 18 is a circuit diagram illustrating a configuration of a fifth address output circuit included in the second address generation circuit of FIG. 17.

Referring to FIG. 18, the fifth address output circuit 550 may include a third signal transmission circuit 5400, a fourth signal transmission circuit 5500 and a second buffer circuit 5600.

The third signal transmission circuit 5400 may receive the second write column address signal WC<2> if the first write bank selection signal ALW<1> has a logic "low" level. The third signal transmission circuit 5400 may inversely buffer the second write column address signal WC<2> to generate a second transmission signal TS<2> if the first write bank selection signal ALW<1> has a logic "high" level. In an embodiment, the third signal transmission circuit 5400 may also receive a complementary first write bank selection signal ALWB<1>.

The fourth signal transmission circuit 5500 may receive the second read column address signal RC<2> if the first read bank selection signal ALR<1> has a logic "low" level. The fourth signal transmission circuit 5500 may inversely buffer the second read column address signal RC<2> to generate the second transmission signal TS<2> if the first read bank selection signal ALR<1> has a logic "high" level. In an embodiment, the fourth signal transmission circuit 5500 may also receive a complementary first read bank selection signal ALRB<1>.

The second buffer circuit 5600 may inversely buffer the second transmission signal TS<2> to output the inversely buffered signal of the second transmission signal TS<2> as the second bit C2_BG<2> of the first bank group address C1_BG<1>, C2_BG<1>, C3_BG<1> and C4_BG<1>.

Each of the sixth to eighth address output circuits 560, 570 and 580 illustrated in FIG. 17 may be realized using substantially the same circuit as the fifth address output circuit 550 illustrated in FIG. 18 except its I/O signals. Thus, descriptions of the sixth to eighth address output circuits 560, 570 and 580 will be omitted hereinafter.

Figure 19:
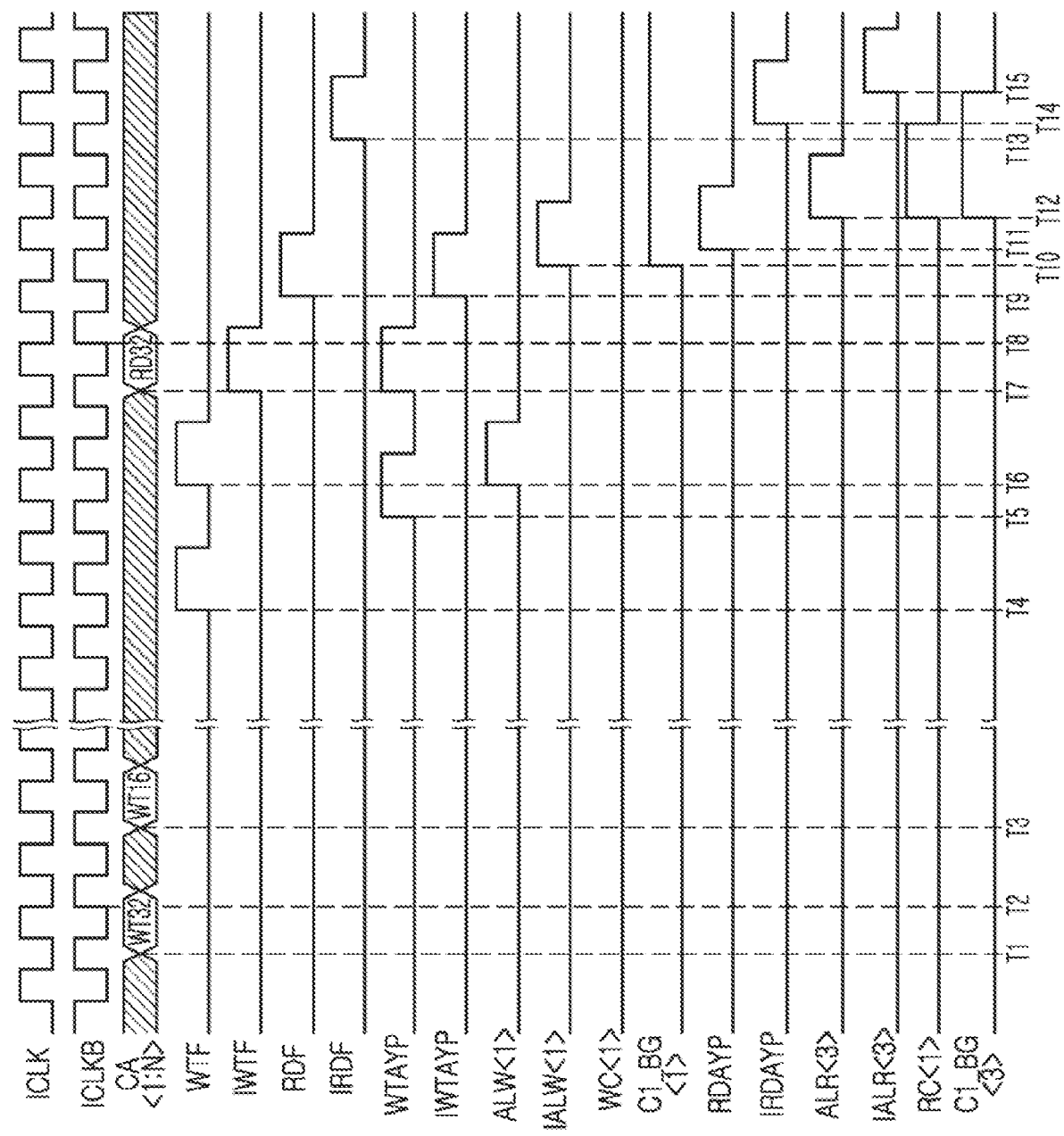
FIG. 19 is a timing diagram illustrating an operation of a semiconductor device according to an embodiment of the present disclosure.

Operations of the semiconductor device having an aforementioned configuration will be described hereinafter with reference to FIG. 19 in conjunction with a column operation of a write operation for a first bank group and a column operation of a read operation for a third bank group.

At a point of time "T1", the first to $N^{th}$ command/address signals CA<1:N> may be inputted to the semiconductor device to perform the write operation. In such a case, the first to $N^{th}$ command/address signals CA<1:N> may have a logic level combination for performing the write operation with a burst length of '32' (i.e., WT32). The burst length of '32' means that the number of bits included in data inputted to the semiconductor device by one write command is thirty-two. In other embodiments, the burst length may be more or less than '32.'

The command pulse generation circuit 1 may generate the first write command pulse EWT1 and the second write command pulse EWT2 according to the first to $N^{th}$ command/address signals CA<1:N>, the internal clock signal ICLK and the inverted internal clock signal ICLKB.

At a point of time "T2", the first and second command/address signals CA<1:2> for selecting the first bank group BK1 as well as the third command/address signal CA<3> for selecting memory cells of the first bank group BK1 among the third to sixth command/address signals CA<3:6> may be inputted to the command pulse generation circuit 1 in synchronization with a rising edge of the inverted internal clock signal ICLKB.

At a point of time "T3", the first to $N^{th}$ command/address signals CA<1:N> may be inputted to the command pulse generation circuit 1 to perform the write operation. In such a case, the first to NO command/address signals CA<1:N> may have a logic level combination for performing the write operation with a burst length of '16' (i.e., WT16). The burst length of '16' means that the number of bits included in data inputted to the semiconductor device by one write command is sixteen.

The command pulse generation circuit 1 may generate the first write command pulse EWT1 and the second write command pulse EWT2 according to the first to $N^{th}$ command/address signals CA<1:N>, the internal clock signal ICLK and the inverted internal clock signal ICLKB.

The flag signal generation circuit 2 may generate the write flag signal WTF at a point of time "T4" that a predetermined period elapses from the point of time "T1" that the first write command pulse EWT1 is generated. The write flag signal WTF may be generated from the first to $N^{th}$ command/address signals CA<1:N> which are inputted at the point of time "T1" for the operation with the burst length of '32'.

The column control pulse generation circuit 3 may generate the write column control pulse WTAYP at a point of time "T5" that a predetermined period elapses from the point of time "T1" that the second write command pulse EWT2 is generated. A period between the point of time "T1" and the point of time "T5" may be set as a write latency period.

The flag signal generation circuit 2 may generate the write flag signal WTF at a point of time "T6" that a predetermined period elapses from the point of time "T3" that the first write command pulse EWT1 is generated. The write flag signal WTF may be generated from the first to $N^{th}$ command/address signals CA<1:N> which are inputted at the point of time "T3" for the operation with the burst length of '16'.

The write control circuit 10 may be synchronized with the write column control pulse WTAYP to generate the first to fourth write column address signals WC<1:4> from the third to sixth command/address signals CA<3:6> inputted at the point of time "T2". In such a case, the first write column address signal WC<1> may be enabled to have a logic "low" level.

The write control circuit 10 may be synchronized with the write column control pulse WTAYP generated at the point of time "T5" to generate the first to fourth write bank selection signals ALW<1:4> from the first and second command/address signals CA<1:2> inputted at the point of time "T2". In such a case, the first write bank selection signal ALW<1> may be enabled.

The first address output circuit 510 of the first address generation circuit 51 may buffer the first write column address signal WC<1> to output the buffered signal of the first write column address signal WC<1> as the first bit C1_BG<1> of the first bank group address signals C1_BG<1>, C2_BG<1>, C3_BG<1> and C4_BG<1> because the first write bank selection signal ALW<1> is enabled.

The first bank group BK1 of the core circuit 6 may perform the column operation based on the first bit C1_BG<1> having a logic "low" level among the bits included in the first bank group address signals. In such a case, the first bank group BK1 of the core circuit 6 may operate with the burst length of '16' to store the data therein.

At a point of time "T7", the first to $N^{th}$ command/address signals CA<1:N> may be inputted to the semiconductor device to perform the read operation. In such a case, the first to $N^{th}$ command/address signals CA<1:N> may have a logic level combination for performing the read operation with a burst length of '32'. The burst length of '32' means that the number of bits included in data inputted to the semiconductor device by one read command is thirty-two.

The command pulse generation circuit 1 may generate the first read command pulse ERD1 and the second read command pulse ERD2 according to the first to $N^{th}$ command/address signals CA<1:N>, the internal clock signal ICLK and the inverted internal clock signal ICLKB.

At a point of time "T8", the first and second command/address signals CA<1:2> for selecting the third bank group BK3 as well as the third command/address signal CA<3> for selecting memory cells of the third bank group BK3 among the third to sixth command/address signals CA<3:6> may be inputted to the command pulse generation circuit 1 in synchronization with a rising edge of the inverted internal clock signal ICLKB.

The flag signal generation circuit 2 may generate the read flag signal RDF at a point of time "T9" that a predetermined period elapses from the point of time "T7" that the first read command pulse ERD1 is generated. A period between the point of time "T7" and the point of time "T9" may be set as a read latency period The column control pulse generation circuit 3 may shift the write column control pulse WTAYP, which is generated at the point of time "T5", by a predetermined period to generate the internal write column control pulse IWTAYP at the point of time "T9".

At a point of time "T10", the write control circuit 10 may be synchronized with the internal write column control pulse IWTAYP generated at the point of time "T9" to generate the first to fourth internal write bank selection signals IALW<1:4> from the first and second command/address signals CA<1:2>. In such a case, the first internal write bank selection signal IALW<1> may be enabled.

The first address output circuit 510 of the first address generation circuit 51 may inversely buffer the first write column address signal WC<1> to output the inversely buffered signal of the first write column address signal WC<1> as the first bit C1_BG<1> of the first bank group address signals C1_BG<1>, C2_BG<1>, C3_BG<1> and C4_BG<1> because the first internal write bank selection signal IALW<1> is enabled.

The first bank group BK1 of the core circuit 6 may perform the column operation based on the first bit C1_BG<1> having a logic "high" level among the bits included in the first bank group address signals. In such a case, the first bank group BK1 of the core circuit 6 may operate with the burst length of '16' to store the data therein.

That is, the first bank group BK1 of the core circuit 6 may operate with the burst length of '32' through the operation performed with the burst length of '16' at the point of time "T6" and the operation performed with the burst length of '16' at the point of time "T8".

The column control pulse generation circuit 3 may generate the read column control pulse RDAYP at a point of time "T11" that a predetermined period elapses from the point of time "T7" that the second read command pulse ERD2 is generated.

At a point of time "T12", the read control circuit 20 may be synchronized with the read column control pulse RDAYP to generate the first to fourth read column address signals RC<1:4> from the third to sixth command/address signals CA<3:6> inputted at the point of time "T7". In such a case, the first read column address signal RC<1> may be enabled to have a logic "high" level.

The read control circuit 20 may be synchronized with the read column control pulse RDAYP generated at the point of time "T1" to generate the first to fourth read bank selection signals ALR<1:4> from the first and second command/address signals CA<1:2> inputted at the point of time "T8". In such a case, the third read bank selection signal ALR<3> may be enabled.

The third address generation circuit 53 may buffer the first read column address signal RC<1> to output the buffered signal of the first read column address signal RC<1> as the first bit C1_BG<3> of the third bank group address signals C1_BG<3>, C2_BG<3>, C3_BG<3> and C4_BG<3> because the third read bank selection signal ALR<3> is enabled.

The third bank group BK3 of the core circuit 6 may perform the column operation based on the first bit C1_BG<3> having a logic "high" level among the bits included in the third bank group address signals. In such a case, the third bank group BK3 of the core circuit 6 may operate with the burst length of '16' to output the data stored therein.

At a point of time "T13", the flag signal generation circuit 2 may shift the read flag signal RDF, which is generated at the point of time "T9", by a predetermined period to generate the internal read flag signal IRDF.

At a point of time "T14", the column control pulse generation circuit 3 may shift the read column control pulse RDAYP, which is generated at the point of time "T11", by a predetermined period to generate the internal read column control pulse IRDAYP.

At a point of time "T15", the read control circuit 20 may be synchronized with the internal read column control pulse IRDAYP generated at the point of time "T14" to generate the first to fourth internal read bank selection signals IALR<1:4> from the first and second command/address signals CA<1:2> inputted at the point of time "T8". In such a case, the third internal read bank selection signal IALR<3> may be enabled.

The first address output circuit 510 of the first address generation circuit 51 may inversely buffer the first read column address signal RC<1> to output the inversely buffered signal of the first read column address signal RC<1> as the first bit C1_BG<3> of the third bank group address signals C1_BG<3>, C2_BG<3>, C3_BG<3> and C4_BG<3> because the third internal read bank selection signal IALR<3> is enabled.

The third bank group BK3 of the core circuit 6 may perform the column operation based on the first bit C1_BG<3> having a logic "low" level among the bits included in the third bank group address signals. In such a case, the third bank group BK3 of the core circuit 6 may operate with the burst length of '16' to output the data stored therein. That is, the third bank group BK3 of the core circuit 6 may operate with the burst length of '32' through the operation performed with the burst length of '16' at the point of time "T12" and the operation performed with the burst length of '16' at the point of time "T15".

As described above, a semiconductor device according to an embodiment may separate a path generating a signal for performing a column operation of a write operation and a path generating a signal for performing a column operation of a read operation from each other and may merge the signals for performing the column operations of the write operation and the read operation using an address generation circuit, thereby preventing the signals for performing the column operations of the write operation and the read operation from interfering with each other.

Figure 20:
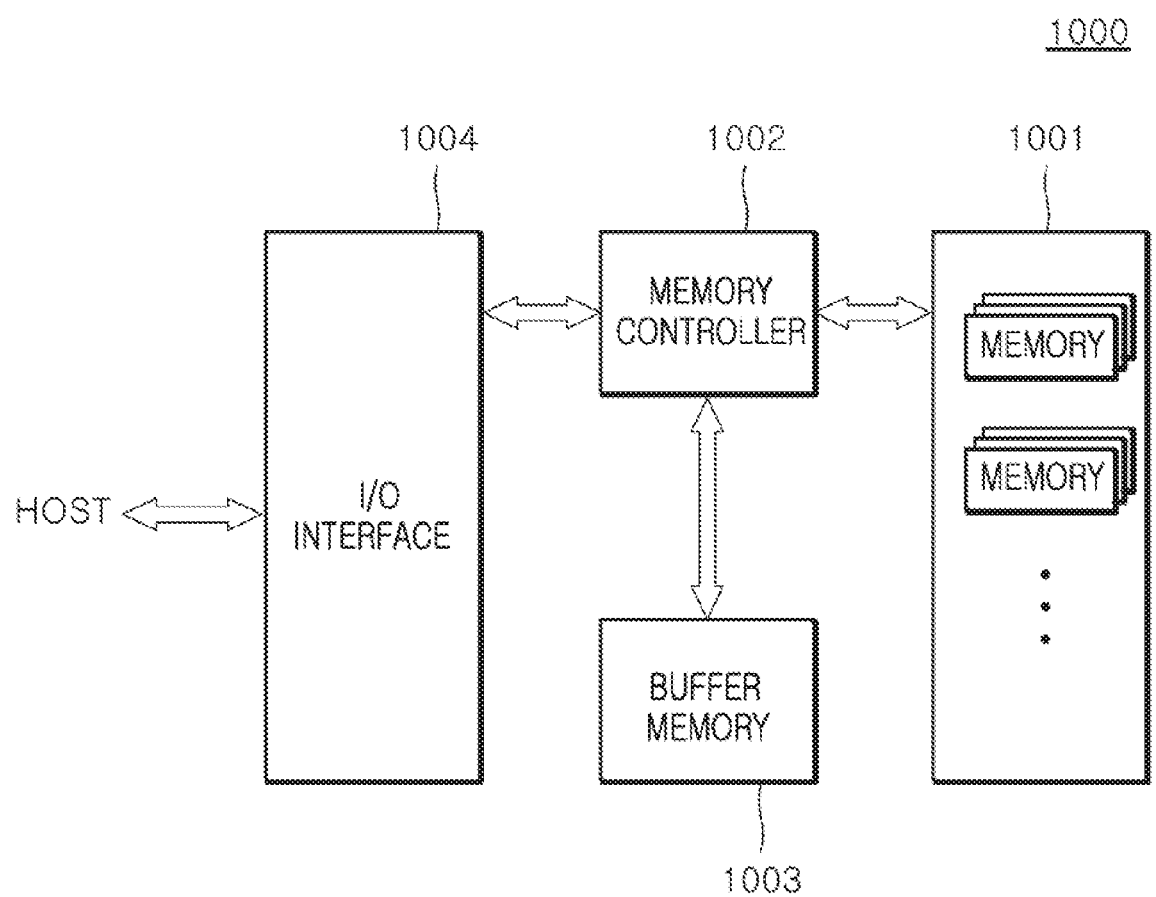
FIG. 20 is a block diagram illustrating a configuration of an electronic system including the semiconductor device illustrated in FIGS. 1 to 19.

The semiconductor devices described with reference to FIGS. 1 to 19 may be applied to electronic systems that may include, for example, a memory system, a graphic system, a computing system, a mobile system, or the like. For example, as illustrated in FIG. 20, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 20 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include the semiconductor devices illustrated in FIG. 1. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a control circuit configured to generate a write column address signal from a command and address (command/address) signal and to generate a write bank selection signal and an internal write bank selection signal from the command/address signal during a write operation and configured to generate a read column address signal from the command/address signal and to generate a read bank selection signal and an internal read bank selection signal from the command/address signal during a read operation, wherein the write bank selection signal and the internal write bank selection signal are sequentially enabled, and wherein the read bank selection signal and the internal read bank selection signal are sequentially enabled; and
   an address generation circuit configured to output the write column address signal as a bank group address signal in synchronization with the write bank selection signal and the internal write bank selection signal or configured to output the read column address signal as the bank group address signal in synchronization with the read bank selection signal and the internal read bank selection signal.

2. The semiconductor device of claim 1, wherein the read operation is preceded by the write operation.

3. The semiconductor device of claim 1, wherein the control circuit includes:
   a write control circuit configured to be synchronized with a write column control pulse and an internal write column control pulse to generate the write column address signal, the write bank selection signal and the internal write bank selection signal from the command/address signal; and
   a read control circuit configured to be synchronized with a read column control pulse and an internal read column control pulse to generate the read column address signal, the read bank selection signal and the internal read bank selection signal from the command/address signal.

4. The semiconductor device of claim 3,
   wherein the write column control pulse and the internal write column control pulse are sequentially enabled during the write operation; and
   wherein the read column control pulse and the internal read column control pulse are sequentially enabled during the read operation.

5. The semiconductor device of claim 3,
   wherein the command/address signal includes a first command/address signal and a second command/address signal; and
   wherein the write control circuit includes:
   a write bank control circuit configured to latch the first command/address signal in synchronization with a write flag signal and an internal write flag signal when a write command pulse is enabled to perform the write operation and configured to generate the write bank selection signal and the internal write bank selection signal from the latched signal of the first command/address signal in synchronization with the write column control pulse and the internal write column control pulse; and
   a write column control circuit configured to generate the write column address signal from the second command/address signal in synchronization with the write column control pulse and the internal write column control pulse when the write command pulse is inputted to the write column control circuit.

6. The semiconductor device of claim 5, wherein the write bank control circuit includes:
   a first pipe control circuit configured to generate a first input control signal and a first output control signal which are enabled in synchronization with the write flag signal and the internal write flag signal when the write command pulse is inputted to the first pipe control circuit;
   a first pipe circuit configured to latch the first command/address signal in synchronization with the first input control signal and configured to output the latched signal of the first command/address signal as a write bank address signal in synchronization with the first output control signal;
   a write delay circuit configured to delay the write column control pulse and the internal write column control pulse to generate a write latch pulse and an internal write latch pulse; and
   a write bank selection signal generation circuit configured to generate the write bank selection signal, in synchronization with the write latch pulse, from the write bank address signal, and configured to generate the internal write bank selection signal, in synchronization with the internal write latch pulse, from the write bank address signal.

7. The semiconductor device of claim 5, wherein the write column control circuit includes:
   a second pipe control circuit configured to generate a second input control signal and a second output control signal which are enabled in synchronization with the write column control pulse and the internal write column control pulse when the write command pulse is inputted to the second pipe control circuit; and
   a second pipe circuit configured to latch the second command/address signal in synchronization with the second input control signal and configured to output the latched signal of the second command/address signal as the write column address signal in synchronization with the second output control signal.

8. The semiconductor device of claim 3,
   wherein the command/address signal includes a first command/address signal and a second command/address signal; and wherein the read control circuit includes:
a read bank control circuit configured to latch the first command/address signal in synchronization with a read flag signal and an internal read flag signal when a read command pulse is enabled to perform the read operation and configured to generate the read bank selection signal and the internal read bank selection signal from the latched signal of the first command/address signal in synchronization with the read column control pulse and the internal read column control pulse; and
a latch circuit configured to generate the read column address signal from the second command/address signal in synchronization with the read column control pulse when the read command pulse is inputted to the latch circuit.

9. The semiconductor device of claim 8, wherein the read bank control circuit includes:
a third pipe control circuit configured to generate a third input control signal and a third output control signal which are enabled in synchronization with the read flag signal and the internal read flag signal when the read command pulse is inputted to the third pipe control circuit;
a third pipe circuit configured to latch the first command/address signal in synchronization with the third input control signal and configured to output the latched signal of the first command/address signal as a read bank address signal in synchronization with the third output control signal;
a read delay circuit configured to delay the read column control pulse and the internal read column control pulse to generate a read latch pulse and an internal read latch pulse; and
a read bank selection signal generation circuit configured to generate the read bank selection signal, in synchronization with the read latch pulse, from the read bank address signal and configured to generate the internal read bank selection signal, in synchronization with the internal read latch pulse, from the read bank address signal.

10. A semiconductor device comprising:
a control circuit configured to generate first and second write column address signals, first and second write bank selection signals and first and second internal write bank selection signals from a command and address (command/address) signal during a write operation and configured to generate first and second read column address signals, first and second read bank selection signals and first and second internal read bank selection signals from the command/address signal during a read operation;
an address generation circuit configured to output the first and second write column address signals as first and second bank group address signals in synchronization with the first and second write bank selection signals and the first and second internal write bank selection signals or configured to output the first and second read column address signals as the first and second bank group address signals in synchronization with the first and second read bank selection signals and the first and second internal read bank selection signals; and
a core circuit configured to include a first bank group and a second bank group,
wherein the first bank group performs the write operation and the read operation when the first bank group address signal is enabled, and
wherein the second bank group performs the write operation and the read operation when the second bank group address signal is enabled.

11. The semiconductor device of claim 10,
wherein the first bank group and the second bank group sequentially store data during the write operation; and
wherein the first bank group and the second bank group sequentially output the data stored therein during the read operation.

12. The semiconductor device of claim 10, wherein the control circuit includes:
a write control circuit configured to be synchronized with a write column control pulse and an internal write column control pulse to generate the first and second write column address signals, the first and second write bank selection signals and the first and second internal write bank selection signals from the command/address signal; and
a read control circuit configured to be synchronized with a read column control pulse and an internal read column control pulse to generate the first and second read column address signals, the first and second read bank selection signals and the first and second internal read bank selection signals from the command/address signal.

13. The semiconductor device of claim 12,
wherein the write column control pulse and the internal write column control pulse are sequentially enabled during the write operation; and
wherein the read column control pulse and the internal read column control pulse are sequentially enabled during the read operation.

14. The semiconductor device of claim 12,
wherein the command/address signal includes a first command/address signal and a second command/address signal; and
wherein the write control circuit includes:
a write bank control circuit configured to latch the first command/address signal in synchronization with a write flag signal and an internal write flag signal when a write command pulse is enabled to perform the write operation and configured to generate the first and second write bank selection signals and the first and second internal write bank selection signals from the latched signal of the first command/address signal in synchronization with the write column control pulse and the internal write column control pulse; and
a write column control circuit configured to generate the first and second write column address signals from the second command/address signal in synchronization with the write column control pulse and the internal write column control pulse when the write command pulse is inputted to the write column control circuit.

15. The semiconductor device of claim 14, wherein the write bank control circuit includes:
a first pipe control circuit configured to generate a first input control signal which is enabled in synchronization with the write flag signal and a first output control signal which is enabled in synchronization with the internal write flag signal when the write command pulse is inputted to the first pipe control circuit;
a first pipe circuit configured to latch the first command/address signal in synchronization with the first input control signal and configured to output the latched signal of the first command/address signal as first and second write bank address signals in synchronization with the first output control signal;

a write delay circuit configured to delay the write column control pulse and the internal write column control pulse to generate a write latch pulse and an internal write latch pulse; and a write bank selection signal generation circuit configured to generate the first and second write bank selection signals, in synchronization with the write latch pulse, from the first and second write bank address signals and configured to generate the first and second internal write bank selection signals, in synchronization with the internal write latch pulse, from the first and second write bank address signals.

16. The semiconductor device of claim 15, wherein the write bank selection signal generation circuit includes:
   a first write bank selection signal generation circuit configured to generate the first write bank selection signal which is enabled in synchronization with the write latch pulse and to generate the first internal write bank selection signal which is enabled in synchronization with the internal write latch pulse, when the first and second write bank address signals have a first logic level combination; and
   a second write bank selection signal generation circuit configured to generate the second write bank selection signal which is enabled in synchronization with the write latch pulse and to generate the second internal write bank selection signal which is enabled in synchronization with the internal write latch pulse, when the first and second write bank address signals have a second logic level combination.

17. The semiconductor device of claim 14, wherein the write column control circuit includes:
   a second pipe control circuit configured to generate a second input control signal and a second output control signal which are enabled in synchronization with the write column control pulse and the internal write column control pulse when the write command pulse is inputted to the second pipe control circuit; and
   a second pipe circuit configured to latch the second command/address signal in synchronization with the second input control signal and configured to output the latched signal of the second command/address signal as the first and second write column address signals in synchronization with the second output control signal.

18. The semiconductor device of claim 12,
   wherein the command/address signal includes a first command/address signal and a second command/address signal; and
   wherein the read control circuit includes:
   a read bank control circuit configured to latch the first command/address signal in synchronization with a read flag signal and an internal read flag signal when a read command pulse is enabled to perform the read operation and configured to generate the first and second read bank selection signals and the first and second internal read bank selection signals from the latched signal of the first command/address signal in synchronization with the read column control pulse and the internal read column control pulse; and
   a latch circuit configured to generate the first and second read column address signals from the second command/address signal in synchronization with the read column control pulse when the read command pulse is inputted to the latch circuit.

19. The semiconductor device of claim 18, wherein the read bank control circuit includes:

a third pipe control circuit configured to generate a third input control signal and a third output control signal which are enabled in synchronization with the read flag signal and the internal read flag signal when the read command pulse is inputted to the third pipe control circuit;

a third pipe circuit configured to latch the first command/address signal in synchronization with the third input control signal and configured to output the latched signal of the first command/address signal as first and second read bank address signals in synchronization with the third output control signal;

a read delay circuit configured to delay the read column control pulse and the internal read column control pulse to generate a read latch pulse and an internal read latch pulse; and a read bank selection signal generation circuit configured to generate the first and second read bank selection signals, in synchronization with the read latch pulse, from the first and second read bank address signals and configured to generate the first and second internal read bank selection signals, in synchronization with the internal read latch pulse, from the first and second read bank address signals.

20. The semiconductor device of claim 19, wherein the read bank selection signal generation circuit includes:
   a first read bank selection signal generation circuit configured to generate the first read bank selection signal which is enabled in synchronization with the read latch pulse and to generate the first internal read bank selection signal which is enabled in synchronization with the internal read latch pulse, when the first and second read bank address signals have a first logic level combination; and
   a second read bank selection signal generation circuit configured to generate the second read bank selection signal which is enabled in synchronization with the read latch pulse and to generate the second internal read bank selection signal which is enabled in synchronization with the internal read latch pulse, when the first and second read bank address signals have a second logic level combination.

21. The semiconductor device of claim 10, wherein the address generation circuit includes:
   a first address generation circuit configured to be synchronized with the first and second write bank selection signals and the first and second internal write bank selection signals to output the first write column address signal as a first bit of the first and second bank group address signals or configured to be synchronized with the first and second read bank selection signals and the first and second internal read bank selection signals to output the first red column address signal as the first bit of the first and second bank group address signals; and
   a second address generation circuit configured to be synchronized with the first and second write bank selection signals to output the second write column address signal as a second bit of the first to fourth bank group address signals or configured to be synchronized with the first and second read bank selection signals to output the second read column address signal as the second bit of the first and second bank group address signals.

22. The semiconductor device of claim 21, wherein the first address generation circuit includes:

a first address output circuit configured to buffer the first write column address signal to output the buffered signal of the first write column address signal as a first bit of the first bank group address signal when the first write bank selection signal is enabled, configured to inversely buffer the first write column address signal to output the inversely buffered signal of the first write column address signal as the first bit of the first bank group address signal when the first internal write bank selection signal is enabled, configured to buffer the first read column address signal to output the buffered signal of the first read column address signal as the first bit of the first bank group address signal when the first read bank selection signal is enabled, and configured to inversely buffer the first read column address signal to output the inversely buffered signal of the first read column address signal as the first bit of the first bank group address signal when the first internal read bank selection signal is enabled; and a second address output circuit configured to buffer the first write column address signal to output the buffered signal of the first write column address signal as a first bit of the second bank group address signal when the second write bank selection signal is enabled, configured to inversely buffer the first write column address signal to output the inversely buffered signal of the first write column address signal as the first bit of the second bank group address signal when the second internal write bank selection signal is enabled, configured to buffer the first read column address signal to output the buffered signal of the first read column address signal as the first bit of the second bank group address signal when the second read bank selection signal is enabled, and configured to inversely buffer the first read column address signal to output the inversely buffered signal of the first read column address signal as the first bit of the second bank group address signal when the second internal read bank selection signal is enabled.

23. The semiconductor device of claim 21, wherein the second address generation circuit includes:
a third address output circuit configured to buffer the second write column address signal to output the buffered signal of the second write column address signal as a second bit of the first bank group address signal when the first write bank selection signal is enabled and configured to buffer the second read column address signal to output the buffered signal of the second read column address signal as the second bit of the first bank group address signal when the first read bank selection signal is enabled; and
a fourth address output circuit configured to buffer the second write column address signal to output the buffered signal of the second write column address signal as a second bit of the second bank group address signal when the second write bank selection signal is enabled and configured to buffer the second read column address signal to output the buffered signal of the second read column address signal as the second bit of the second bank group address signal when the second read bank selection signal is enabled.

* * * * *